(12) United States Patent
Cho et al.

(10) Patent No.: US 12,401,003 B2
(45) Date of Patent: Aug. 26, 2025

(54) MANUFACTURING METHOD FOR FORMING AN INORGANIC LIGHT EMITTING ELEMENT HAVING A LOW SURFACE ROUGHNESS

(71) Applicant: Samsung Display Co., LTD., Yongin-si (KR)

(72) Inventors: Hyun Min Cho, Seoul (KR); Dae Hyun Kim, Hwaseong-si (KR); Dong Uk Kim, Hwaseong-si (KR); Jung Hong Min, Pyeongtaek-si (KR); Seung A Lee, Seoul (KR); Hyung Rae Cha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/483,444

(22) Filed: Oct. 9, 2023

(65) Prior Publication Data

US 2024/0038738 A1   Feb. 1, 2024

Related U.S. Application Data

(63) Continuation of application No. 17/250,633, filed as application No. PCT/KR2019/000105 on Jan. 3, 2019, now Pat. No. 11,810,905.

(30) Foreign Application Priority Data

Aug. 16, 2018   (KR) .................. 10-2018-0095709

(51) Int. Cl.
*H01L 25/075*   (2006.01)
*H10D 86/40*   (2025.01)
(Continued)

(52) U.S. Cl.
CPC ......... *H01L 25/0753* (2013.01); *H10D 86/40* (2025.01); *H10D 86/60* (2025.01);
(Continued)

(58) Field of Classification Search
CPC .... H10D 86/40; H10D 86/60; H01L 25/0753; H10K 2102/341; H10H 20/80; H10H 20/84; H10H 29/80
See application file for complete search history.

(56) References Cited

U.S. PATENT DOCUMENTS 8,237,761 B2   8/2012   Yonehara et al.
8,670,015 B2   3/2014   Yonehara et al.
(Continued)

FOREIGN PATENT DOCUMENTS

EP   2 704 215 A2   3/2014
JP   2009-152474 A   7/2009
(Continued)

OTHER PUBLICATIONS

International Search Report for corresponding Application No. PCT/KR2019/000105 dated May 16, 2019, 4pp.
(Continued)

*Primary Examiner* — Davienne N Monbleau
*Assistant Examiner* — Emily Nicole Farmer
(74) *Attorney, Agent, or Firm* — Womble Bond Dickinson (US) LLP

(57) ABSTRACT

Provided are a light emitting device, a method for manufacturing same, and a display device including the light emitting device. The method for manufacturing the light emitting device comprises the steps of: preparing a lower substrate including a substrate and a buffer semiconductor layer formed on the substrate, forming an element rod by forming a separating layer disposed on the lower substrate, forming a first conductivity type semiconductor layer, an
(Continued)

active material layer, and a second conductivity type semiconductor layer on the separating layer, and etching the first conductivity type semiconductor layer, the active material layer, the second conductivity type semiconductor layer, and the separating layer in a direction perpendicular to the lower substrate, forming a first insulating layer surrounding an outer circumferential surface of the element rod, forming a second insulating layer surrounding an outer circumferential surface of the first insulating layer and separating the element rod from the lower substrate to form a light emitting element.

11 Claims, 21 Drawing Sheets

(51) Int. Cl.
*H10D 86/60* (2025.01)
*H10H 20/01* (2025.01)
*H10H 20/82* (2025.01)
*H10H 20/857* (2025.01)

(52) U.S. Cl.
CPC .......... *H10H 20/018* (2025.01); *H10H 20/82* (2025.01); *H10H 20/857* (2025.01); *H10H 20/0364* (2025.01)

(56) References Cited

U.S. PATENT DOCUMENTS

| | | | |
|---|---|---|---|
| 10,145,518 B2 | 12/2018 | Do et al. | |
| 10,641,439 B2 | 5/2020 | Do et al. | |
| 10,862,000 B2 | 12/2020 | Min et al. | |
| 11,112,070 B2 | 9/2021 | Do et al. | |
| 11,635,176 B2 | 4/2023 | Do et al. | |
| 11,810,905 B2 * | 11/2023 | Cho | H01L 33/0093 |
| 2004/0264270 A1 * | 12/2004 | Iwata | H01L 29/40117 |
| | | | 257/E21.507 |
| 2009/0137075 A1 * | 5/2009 | Yang | H10H 20/018 |
| | | | 257/E33.068 |
| 2010/0026779 A1 | 2/2010 | Yonehara et al. | |
| 2011/0089850 A1 | 4/2011 | Shibata et al. | |
| 2011/0254043 A1 | 10/2011 | Negish et al. | |
| 2012/0282716 A1 | 11/2012 | Yonehara et al. | |
| 2013/0105836 A1 | 5/2013 | Yokozeki et al. | |
| 2014/0145237 A1 | 5/2014 | Do et al. | |
| 2016/0013170 A1 | 1/2016 | Sakariya et al. | |
| 2016/0322536 A1 | 11/2016 | Dornel et al. | |
| 2018/0019377 A1 | 1/2018 | Kim et al. | |
| 2018/0175104 A1 | 6/2018 | Kang et al. | |
| 2019/0326474 A1 | 10/2019 | Kim et al. | |
| 2021/0265529 A1 | 8/2021 | Kim et al. | |

FOREIGN PATENT DOCUMENTS

| | | | | |
|---|---|---|---|---|
| JP | 2013-110374 | A | 6/2013 | |
| KR | 10-2019-0074091 | A | 7/2009 | |
| KR | 20090074091 | A | 7/2009 | |
| KR | 10-2012-0122159 | A | 11/2012 | |
| KR | 10-2012-0122160 | A | 11/2012 | |
| KR | 10-1244926 | B1 | 3/2013 | |
| KR | 10-1436123 | B1 | 11/2014 | |
| KR | 10-2015-0006798 | A | 1/2015 | |
| KR | 10-2016-0059569 | A | 5/2016 | |
| KR | 101627365 | B1 | 6/2016 | |
| KR | 10-2017-0018112 | A | 2/2017 | |
| KR | 10-2018-0009014 | A | 1/2018 | |
| KR | 10-2020-0001649 | A | 1/2020 | |
| KR | 10-2020-0004936 | A | 1/2020 | |
| WO | WO 2012/148231 | A2 | 11/2012 | |
| WO | WO-2017188656 | A1 * | 11/2017 | H01L 33/007 |

OTHER PUBLICATIONS

Extended European Search Report dated Apr. 20, 2022, in corresponding European Patent Application No. 19849162.3 (8 pages).

* cited by examiner

MANUFACTURING METHOD FOR FORMING AN INORGANIC LIGHT EMITTING ELEMENT HAVING A LOW SURFACE ROUGHNESS

CROSS-REFERENCE TO RELATED APPLICATION

This application is a continuation of U.S. patent application Ser. No. 17/250,633, filed Feb. 12, 2021, which is a U.S. National Phase Patent Application of Korean International Application No. PCT/KR2019/000105, which claims priority to Korean Patent Application No. 10-2018-0095709 filed on Aug. 16, 2018, the entire content of all of which is incorporated herein by reference.

TECHNICAL FIELD

The present disclosure relates to a light emitting element, a manufacturing method thereof, and a display device including the light emitting element and, in particular, to a light emitting element including a protective layer on an outer surface thereof, a manufacturing method thereof, and a display device including the light emitting element.

BACKGROUND ART

The importance of display devices has steadily increased with the development of multimedia technology. Accordingly, various types of display devices such as an organic light emitting display (OLED), a liquid crystal display (LCD) and the like have been used.

A display device is a device for displaying an image, and includes a display panel, such as an organic light emitting display panel or a liquid crystal display panel. Among them, a light emitting display panel may include a light emitting element. Examples of a light emitting diode (LED) include an organic light emitting diode (OLED) using an organic material as a fluorescent material, and an inorganic light emitting diode using an inorganic material as a fluorescent material.

The organic light emitting diode (OLED) using an organic material as a fluorescent material of a light emitting element has advantages in that a manufacturing process is simple and a display device can have flexibility. However, it is known that the organic material is vulnerable to a high-temperature operating environment and the blue light efficiency is relatively low.

DISCLOSURE

Technical Problem

The inorganic light emitting diode may be manufactured by growing an n-type or p-type doped semiconductor layer and an inorganic fluorescent material layer on a substrate, forming a rod having a specific shape, and separating the rod. However, when using a chemical method to separate the light emitting element, there is a problem that an insulating material layer surrounding the outer surface of the light emitting element is partially damaged.

In view of the above, aspects of the present disclosure provide a light emitting element including a protective layer protecting an insulating material layer on an outer circumferential surface of the light emitting element and a manufacturing method thereof.

It should be noted that aspects of the present disclosure are not limited to the above-mentioned aspects, and other unmentioned aspects of the present disclosure will be clearly understood by those skilled in the art from the following descriptions.

Technical Solution

According to an exemplary of the present disclosure, a manufacturing method of a light emitting element, comprises preparing a lower substrate including a substrate and a buffer semiconductor layer formed on the substrate, forming an element rod by forming a separating layer disposed on the lower substrate, forming a first conductivity type semiconductor layer, an active material layer, and a second conductivity type semiconductor layer on the separating layer, and etching the first conductivity type semiconductor layer, the active material layer, the second conductivity type semiconductor layer, and the separating layer in a direction perpendicular to the lower substrate, forming a first insulating layer surrounding an outer circumferential surface of the element rod, forming a second insulating layer surrounding an outer circumferential surface of the first insulating layer and separating the element rod from the lower substrate to form a light emitting element.

The forming of the light emitting element may comprise etching and removing the separating layer by an etchant for separation containing fluorine (F), and the second insulating layer may have an etch selectivity with respect to the etchant, which is greater than an etch selectivity of the separating layer with respect to the etchant.

The second insulating layer may have an etch selectivity with respect to the etchant, which is greater than an etch selectivity of the first insulating layer with respect to the etchant.

The first insulating layer may include at least one of silicon oxide ($SiO_x$), aluminum oxide ($Al_2O_3$), or silicon oxynitride ($SiO_xN_y$), and the second insulating layer includes at least one of silicon nitride (SiNx), aluminum nitride (AlN), or silicon oxynitride ($SiO_xN_y$).

In the light emitting element, a parting surface where the element rod is separated by removing the separating layer, may be substantially flat and parallel to a top surface of the second conductivity type semiconductor layer.

In the light emitting element, the parting surface may have a surface roughness in a range of 8 nm Ra to 12 nm Ra.

The first insulating layer may have a substantially constant thickness in a long axis direction crossing both ends of the light emitting element.

The forming of the first insulating layer may comprise forming a first insulating layer disposed to cover an outer surface of the element rod and a first etching step of exposing a top surface of the element rod by etching the first insulating layer, and wherein the forming of the second insulating layer may comprise forming a second insulating layer disposed to cover the outer surface of the element rod and a second etching step of exposing the top surface of the element rod by etching the second insulating layer.

In the first etching step and the second etching step, at least a part of the separating layer in an area overlapping a separation region of the element rod may be exposed.

The second insulating layer may be formed to surround an outer surface of the first insulating layer after forming the first insulating layer, and the first etching step and the second etching step may be simultaneously performed after forming the second insulating layer.

The forming of the element rod may further comprise forming an electrode material layer on the second conductivity type semiconductor layer.

The forming of the element rod may comprise forming an etching mask layer on the electrode material layer and an etching pattern layer having one or more nanopatterns separated from each other on the etching mask layer, forming a hole by etching an area formed by the nanopatterns being separated from each other in a direction perpendicular to the lower substrate and removing the etching mask layer and the etching pattern layer.

The first conductivity type semiconductor layer, the active material layer, the second conductivity type semiconductor layer, and the electrode material layer may include a material different in etch selectivity from the separating layer, and the forming of the hole may further comprise etching the first conductivity type semiconductor layer, the active material layer, the second conductivity type semiconductor layer, and the electrode material layer in a direction perpendicular to the lower substrate to expose at least a portion of an overlapping area between the separating layer and the area formed by the nanopatterns being separated from each other; and etching and patterning the exposed area of the separating layer.

According to another exemplary embodiment of the present disclosure, a light emitting element comprises a first conductivity type semiconductor doped with a first polarity, an active layer disposed on the first conductivity type semiconductor, a second conductivity type semiconductor formed on the active layer and doped with a second polarity opposite to the first polarity, an electrode material layer disposed on the second conductivity type semiconductor and a first insulating layer surrounding side surfaces of the first conductivity type semiconductor, the second conductivity type semiconductor, the active layer and the electrode material layer, and a second insulating layer surrounding an outer circumferential surface of the first insulating layer, wherein the first insulating layer and the second insulating layer are different in etch selectivity.

An etch selectivity of the second insulating layer with respect to the etchant containing fluorine (F) may be greater than an etch selectivity of the first insulating layer with respect to the etchant.

The first insulating layer includes at least one of silicon oxide (SiOx), aluminum oxide ($Al_2O_3$), or silicon oxynitride (SiOxNy), and the second insulating layer includes at least one of silicon nitride (SiNx), aluminum nitride (AlN), or silicon oxynitride (SiOxNy).

A bottom surface of the first conductivity type semiconductor and a top surface of the second conductivity type semiconductor may be substantially flat and parallel to each other, and the bottom surface of the first conductivity type semiconductor and the top surface of the second conductivity type semiconductor may have a surface roughness in a range of 8 nm Ra to 12 nm Ra.

According to the other exemplary of the present disclosure, a display device comprises a substrate, at least one first electrode and at least one second electrode extending in a first direction on the substrate and spaced apart from each other in a second direction different from the first direction, at least one light emitting element disposed in a separation space between the first electrode and the second electrode, a first contact electrode partially covering the first electrode and contacting a first end of the light emitting element, and a second contact electrode spaced apart from the first contact electrode and partially covering the second electrode to contact a second end opposite to the first end of the light emitting element, wherein the light emitting element includes an element rod, a first insulating layer surrounding an outer circumferential surface of the element rod, and a second insulating layer surrounding at least a portion of an outer circumferential surface of the first insulating layer.

The element rod may include a first conductivity type semiconductor doped with a first polarity, an active layer disposed on the first conductivity type semiconductor, a second conductivity type semiconductor formed on the active layer and doped with a second polarity opposite to the first polarity, and an electrode material layer formed on the second conductivity type semiconductor, wherein the first insulating layer may surround side surfaces of the first conductivity type semiconductor, the active layer, the second conductivity type semiconductor, and the electrode material layer, and the second insulating layer may include a material different in etch selectivity from the insulating material layer.

In the second insulating layer, top surfaces of the first end and the second end of the light emitting element in cross-sectional view may be patterned to partially expose the first insulating layer, and the first contact electrode and the second contact electrode may be partially in contact with the exposed first insulating layer.

The above and other features and advantages of the present invention will become more apparent by describing in detail exemplary embodiments thereof with reference to the attached drawings.

Advantageous Effects

According to a manufacturing method of a light emitting element according to an embodiment, it is possible to manufacture a light emitting element in which an insulating material layer and an insulating protective layer, different in etch selectivity, are disposed on an outer circumferential surface of the light emitting element. Although the light emitting element is formed by a chemical lift off (CLO) method during manufacture of the light emitting element, the insulating protective layer can protect the insulating material layer to have a constant thickness without being damaged by an etchant for separation.

The light emitting element being arranged between two electrodes of a display device has two end surfaces that are flat and substantially parallel, which is capable of preventing an open or short circuit problem of a contact electrode material from occurring in the case of connection with a contact electrode.

Advantageous effects according to the present disclosure are not limited to those mentioned above, and various other advantageous effects are included herein.

MODES OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, exemplary embodiments will be described with reference to the accompanying drawings.

Figure 1:
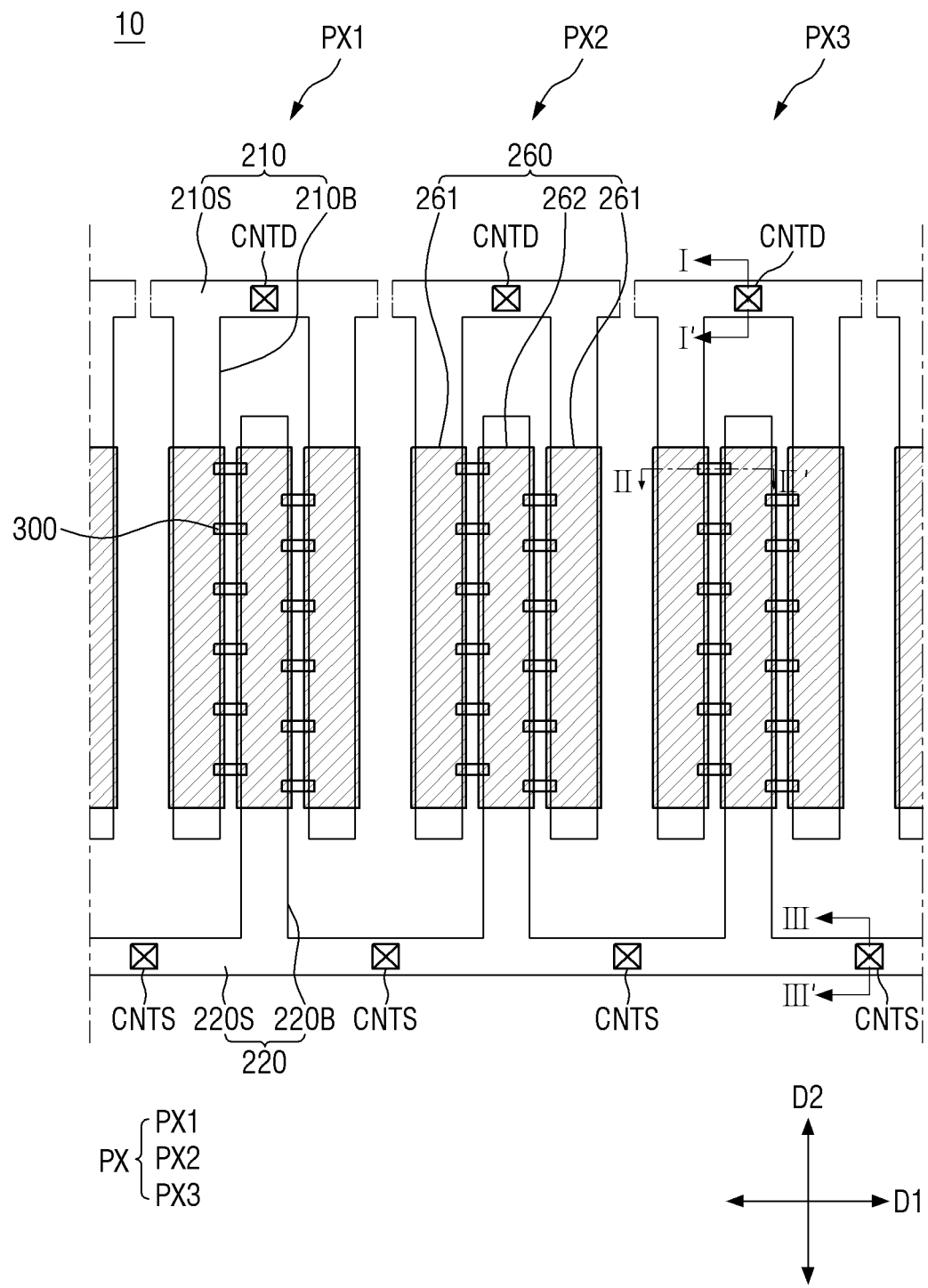
FIG. 1 is a plan view of a display device according to an embodiment.

FIG. 1 is a plan view of a display device according to an embodiment.

The display device 10 may include at least one area defined as a pixel PX. The display device 10 may include a display area composed of a plurality of pixels PX, each emitting light in a specific wavelength band to the outside of the display device 10. Although three pixels PX1, PX2, and PX3 are exemplarily illustrated in FIG. 1, it is obvious that the display device 10 may include a larger number of pixels. Although it is shown in the drawing that a plurality of pixels PX are arranged in one direction, e.g., first direction D1, in cross-sectional view, the plurality of pixels PX may also be arranged in the second direction D2 crossing the first direction D1. Further, each of the pixels PX of FIG. 1 may be divided into a plurality of portions, and each portion may constitute one pixel PX. The pixels are not necessarily arranged in parallel only in the first direction D1 as shown in FIG. 1, and may have various structures, such as being arranged in a vertical direction (or the second direction D2) or in a zigzag manner.

Although not shown in the drawing, the display device 10 may include an emission area in which light emitting elements 300 are arranged for emitting certain color lights, and a non-emission area defined as an area remaining after exclusion of the emission area. The non-emission area may be covered by certain members that are not visually perceived from the outside of the display device 10. Various members for driving the light emitting elements 300 disposed in the emission area may be disposed in the non-emission area. For example, the non-emission area may include a wiring, a circuit unit, and a driving unit for applying an electrical signal to the emission area, but the present disclosure is not limited thereto.

The plurality of pixels PX may display colors by including one or more light emitting elements 300 emitting light of a specific wavelength band. The light emitted from the light emitting element 300 may be projected to the outside through the emission area of the display device 10. In an embodiment, each of the pixels PX presenting different colors may include different light emitting elements 300 emitting different color lights. For example, a first pixel PX1 presenting a red color may include a light emitting element 300 emitting a red light, a second pixel PX2 presenting a green color may include a light emitting element 300 emitting a green light, and a third pixel PX1 presenting a blue color may include a light emitting element 300 emitting a blue light. However, the present disclosure is not limited thereto, and the pixels presenting different colors may, in some cases, include the light emitting elements 300 emitting the same color light (e.g., blue light), or they may each include a wavelength conversion layer or a color filter on a light emission path, to produce pixel-specific colors. However, the present disclosure is not limited thereto, and adjacent pixels PX may emit the same color light in some cases.

With reference to FIG. 1, the display device 10 may include a plurality of electrodes 210 and 220 and a plurality of light emitting elements 300. At least a portion of each of the electrodes 210 and 220 may be arranged in each pixel PX, and electrically connected to the light emitting elements 300 to apply an electrical signal, in order for the light emitting elements 300 to emit a certain color light.

At least a portion of each of the electrodes 210 and 220 may also contribute to producing an electric field in the pixels PX, to align the light emitting elements 300. In more detail, it is necessary to precisely align the pixel-specific (PX-specific) light emitting elements 300 during the alignment of the light emitting elements 300 emitting different color lights in the plurality of pixels PX. In the case of using an electrophoresis method for aligning the light emitting elements 300, the light emitting elements 300 may be aligned in a way of depositing a solution including the light emitting elements 300 on the display device 10, and applying alternating power thereto to create a capacitance with an electric field, which produces an electrophoresis force to the light emitting elements 300.

The plurality of electrodes 210 and 220 may include a first electrode 210 and a second electrode 220. In an exemplary embodiment, the first electrode 210 may be a pixel electrode branched to each pixel PX, and the second electrode 220 may be a common electrode connected in common to the plurality of plurality of pixels PX. One of the first and second electrodes 210 and 220 may be an anode electrode of the light emitting element 300, and the other may be a cathode electrode of the light emitting element 300. However, the present disclosure is not limited thereto, and the reverse may also be the case.

The first and second electrodes 210 and 220 may include respective electrode stems 210S and 220S arranged to extend in the first direction D1 and at least one respective electrode branches 210B and 220B extending, in the second direction D2 crossing the first direction D1, from the respective electrode stems 210S and 220S.

In detail, the first electrode 210 may include a first electrode stem 210S arranged to extend in the first direction D1, and at least one first electrode branch 210B branched from the first electrode stem 210S and extending in the second direction D2. Although not shown in the drawing, the first electrode stem 210S may be connected, at one end thereof, to a signal input pad and extend, at the other end thereof, in the first direction D1, maintaining electrical disconnection between the pixels PX. The signal input pad may be connected to a power source of the display device 10 or the outside, to apply an electrical signal or, in the case of aligning the light emitting elements 300, alternating power to the first electrode stem 210S.

The first electrode stem 210S of one pixel may be arranged substantially on the same line as the first electrode stem 210S of neighboring pixels belonging to the same row (e.g., adjacent in the first direction D1). That is, the first electrode stem 210S of one pixel may be arranged such that two ends thereof terminate between corresponding pixels while being spaced apart from each other, and the first electrode stems 210S of the neighboring pixels may be aligned with an extension line of the first electrode stem 210S of the one pixel. In this manner, the first electrode stem 210S may be arranged in a way of being formed as an continuous stem electrode in a manufacturing process, and cut off by a laser or the like to be open after performing the alignment process of the light emitting elements 300. Accordingly, the first electrode stems 210S of the respective pixels PX may apply different electrical signals to the respective first electrode branches 210B, which may operate independently of each other.

The first electrode branch 210B may be branched from at least part of the first electrode stem 210S and extend in the second direction D2, and may terminate to keep a distance from the second electrode stem 220S arranged to face the first electrode stem 210S. That is, the first electrode branch 210B may be arranged to be connected, at one end thereof, to the first electrode stem 210S and placed, at the other end thereof, inside the pixel PX, keeping a distance from the second electrode stem 220S. The first electrode branch 210B may be connected to the first electrode stem 210S, which is electrically separate per pixel PX, so as to receive a different electrical signal per pixel PX.

It may also be possible that one or more first electrode branches 210B are arranged per pixel PX. Although it is shown in FIG. 1 that two first electrode branches 210B are arranged and the second electrode branch 220B is arranged therebetween, the present disclosure is not limited thereto, and more first electrode branches 210B may be arranged. In this case, the first electrode branches 210B may be arranged alternately, to be separated from the plurality of second electrode branches 220B, such that a plurality light emitting elements 300 are arranged therebetween. In some embodiments, the second electrode branch 220B may be arranged between the first electrode branches 210B such that each pixel PX is symmetrical about the second electrode branch 220B. However, the present disclosure is not limited thereto.

The second electrode 220 may include a second electrode stem 220S arranged to extend in the first direction D1 and face the first electrode stem 210S, keeping a distance from the first electrode stem 210S, and at least one second electrode branch 220B branched from the second electrode stem 220S to extend in the second direction D2 and face the first electrode branch 210B, keeping a distance from the first electrode branch 210B. The second electrode stem 220S may also be connected to the signal input pad at one end thereof, like the first electrode stem 210S. However, the second electrode stem 220S may extend, at the other end thereof, in the first direction D1 toward the a plurality of adjacent pixels PX. That is, the second electrode stem 220S may be electrically continuous between individual pixels PX. Accordingly, the second electrode stem 220S of a certain pixel is connected at opposite ends thereof to one ends of the second electrode stems 220S of the neighboring pixels between the pixels PX to apply the same electrical signal to each pixel PX.

The second electrode branch 220B may be branched from at least part of the second electrode stem 220S and extend in the second direction D2, and may terminate to keep a distance from the first electrode stem 210S. That is, the second electrode branch 220B may be arranged to be connected at one end thereof to the second electrode stem 220S, and placed at the other end thereof inside the pixel PX, keeping a distance from the first electrode stem 210S. The second electrode branch 220B may be connected to the second electrode stem 220S, which is electrically continuous to the respective pixels PX, so as to receive the same electrical signal for each pixel PX.

The second electrode branch 220B may be arranged to face the first electrode branch 210B keeping a distance from the first electrode branch 210B. Here, the first and second electrode stems 210S and 220S face each other about the center of each pixel PX, keeping a distance, such that the first and second electrode branches 210B and 220B extend in the opposite directions. That is, the first electrode branch 210B may extend to one orientation of the second direction D2 and the second electrode branch 220B may extend to the other orientation of the second direction D2, such that one ends of the respective branches are arranged to face opposite orientations about the center of the pixel PX. However, the present disclosure is not limited thereto, and the first and second electrode stems 210S and 220S may be arranged to face the same orientation about the center of the pixel PX, keeping a distance from each other. In this case, the first and second electrode branches 210B and 220B branched from the respective electrode stems 210S and 220S may extend in the same direction.

Although it is shown in FIG. 1 that one second electrode branch 220B is arranged in each pixel PX, the present disclosure is not limited thereto, and more second electrode branches 220B may be arranged.

The plurality of light emitting elements 300 may be aligned between the first and second electrode branches 210B and 220B. In detail, at least part of the plurality of the light emitting elements 300 are each electrically connected at one end thereof to the first electrode branch 210B and at the other end thereof to the second electrode branch 220B.

The plurality of light emitting elements 300 may be aligned substantially in parallel with one another keeping a distance in the second direction D2. The interval between the light emitting elements 300 is not particularly limited. One plurality of light emitting elements 300 may be adjacently arranged to form a cluster while another plurality of light emitting elements 300 may be arranged keeping a predetermined distance from one another to form a cluster, and they may also be aligned to face one orientation at a non-uniform density.

The first and second electrode branches 210B and 220B may have respective contact electrodes 260 arranged thereon.

The plurality of contact electrodes 260 may be arranged to extend in the second direction D2, and spaced apart from one another in the first direction D1. The contact electrodes 260 may contact at least one ends of the light emitting elements 300, and may contact the first and second electrodes 210 and 220 to receive an electrical signal. Accordingly, the contact electrodes 260 may transfer the electrical signal received through the first and second electrodes 220 to the light emitting elements 300.

The contact electrodes 260 may include a first contact electrode 261 and a second contact electrode 262 arranged on the respective electrode branches 210B and 220B to partially cover them and contact one or the other ends of the light emitting elements 300.

The first contact electrode 261 may be arranged on the first electrode branch 210B to contact one ends of the light emitting elements 300 that are electrically connected to the first electrode 210. The second contact electrode 262 may be arranged on the second electrode branch 220B to contact the other ends of the light emitting elements 300 that are electrically connected to the second electrode 220.

In some embodiments, the opposite ends of each of the light emitting elements 300 that are each electrically connected to the first electrode branch 210B or the second electrode branch 220B may be an n-type or p-type doped conductive semiconductor layer. In the case where one end of a light emitting element 300 that is electrically connected to the first electrode branch 210B is a p-type doped conductive semiconductor layer, the other end of the light emitting element 300 that is electrically connected to the second electrode branch 220B may be an n-type doped conductive semiconductor layer. However, the present disclosure is not limited thereto, and an opposite case may also be possible.

The first and second contact electrodes 261 and 262 may be arranged to partially cover the respective first and second electrode branches 210B and 220B. As shown in FIG. 1, the first and second contact electrodes 261 and 262 may be arranged to extend in the second direction D2, and face each other keeping a distance. However, the first and second contact electrodes 261 and 262 may terminate at one ends thereof to expose one ends of the respective electrode branches 210B and 220B. The first and second contact electrodes 261 and 262 may also terminate at the other ends thereof so as not to overlap the respective electrode stems 210S and 220S and be spaced apart therefrom. However, the present disclosure is not limited thereto, the first and second contact electrodes 261 and 262 may cover the respective electrode branches 210B and 220B.

Meanwhile, as shown in FIG. 1, the first and second electrode stems 210S and 220S may be electrically connected to a thin film transistor 120 or a power wiring 161 (to be described later) via respective contact holes, e.g., a first electrode contact hole CNTD and a second electrode contact hole CNTS. Although it is shown in FIG. 1 that the first and second electrode stems 210S and 220S each have a contact hole arranged thereon per pixel PX, the present disclosure is not limited thereto. Because the second electrode stem 220S may extend to establish an electrical connection with the adjacent pixels PX as described above, the second electrode stem 220S may, in some embodiments, be electrically connected to the thin film transistor via one contact hole.

A description is made hereinafter of the configuration of the plurality of members arranged on the display device 10 in more detail with reference to FIG. 2.

Figure 2:
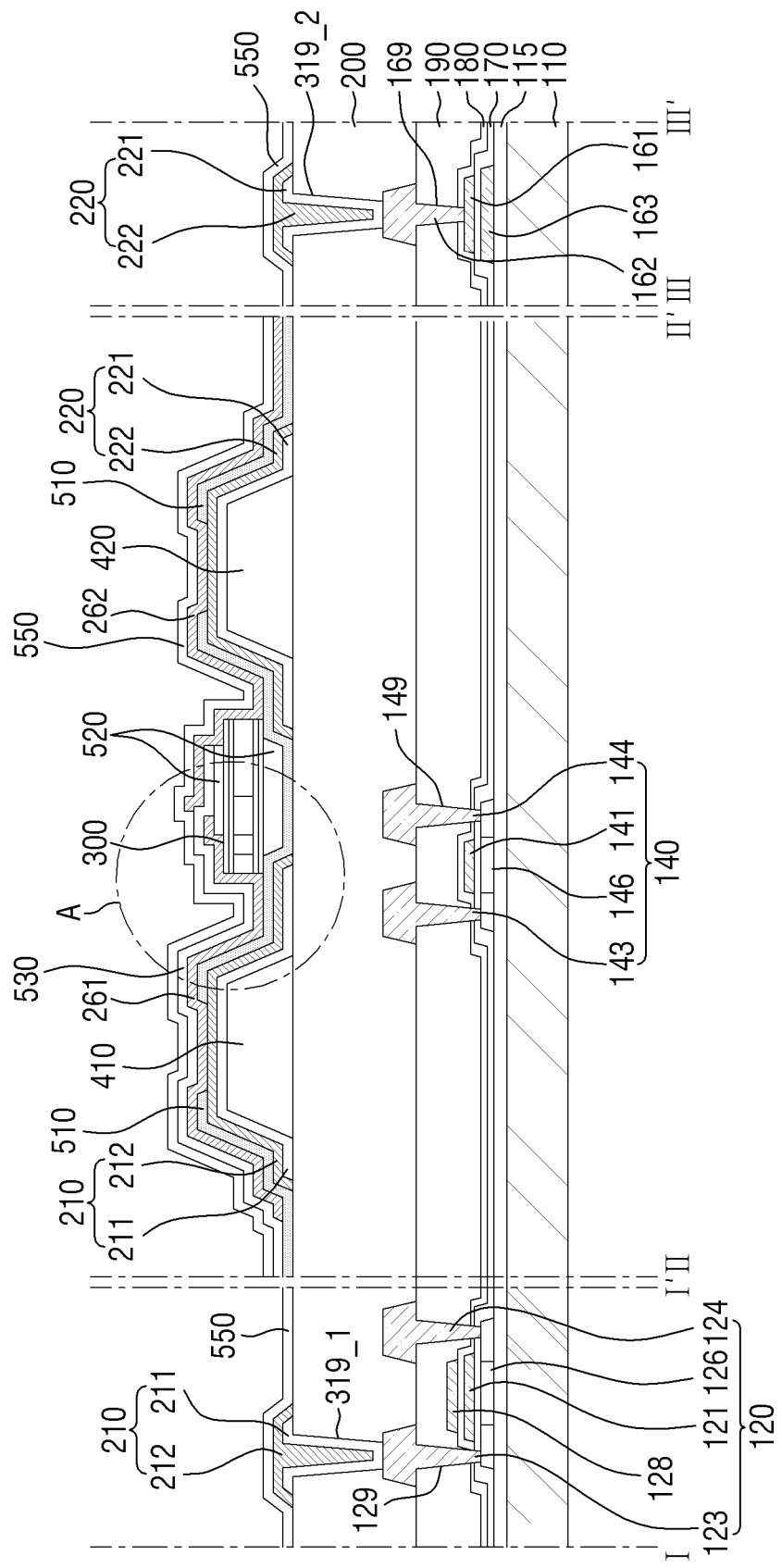
FIG. 2 is a cross-sectional view taken along lines I-I', II-II' and III'-III' of FIG. 1.

FIG. 2 is a cross-sectional view taken along lines I-I', II-II' and III-III' of FIG. 1. Although FIG. 2 shows a single pixel PX, the configuration may be identically applicable to other pixels. FIG. 2 shows a cross section across one and the other ends of a certain light emitting element 300.

Referring to FIGS. 1 and 2, the display device 10 may include a substrate 110, thin film transistors 120 and 140 disposed on the substrate 110, and the electrodes 210 and 220 disposed on the thin film transistors 120 and 140, and the light emitting elements 300. The thin film transistors may include a first thin film transistor 120 and a second thin film transistor 140, and they may be a driving transistor and a switching transistor, respectively. Each of the thin film transistors 120 and 140 may include an active layer, a gate electrode, a source electrode, and a drain electrode. The first electrode 210 may be electrically connected to the drain electrode of the first thin film transistor 120.

Specifically, the substrate 110 may be an insulating substrate. The substrate 110 may be made of an insulating material such as glass, quartz, or polymer resin. Examples of the polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. Further, the substrate 110 may be a rigid substrate, but may also be a flexible substrate which can be bent, folded or rolled.

A buffer layer 115 may be disposed on the substrate 110. The buffer layer 115 can prevent diffusion of impurity ions, prevent penetration of moisture or external air, and perform a surface planarization function. The buffer layer 115 may include silicon nitride, silicon oxide, silicon oxynitride, or the like.

A semiconductor layer is disposed on the buffer layer 115. The semiconductor layer may include a first active layer 126 of the first thin film transistor 120, a second active layer 146 of the second thin film transistor 140, and an auxiliary layer 163. The semiconductor layer may include polycrystalline silicon, monocrystalline silicon, oxide semiconductor, and the like.

A first gate insulating layer 170 is disposed on the semiconductor layer. The first gate insulating layer 170 covers the semiconductor layer. The first gate insulating layer 170 may function as a gate insulating film of the thin film transistor. The first gate insulating layer 170 may include silicon oxide, silicon nitride, silicon oxynitride, aluminum oxide, tantalum oxide, hafnium oxide, zirconium oxide, titanium oxide, or the like. These may be used alone or in combination with each other.

A first conductive layer is disposed on the first gate insulating layer 170. The first conductive layer may include a first gate electrode 121 disposed on the first active layer 126 of the first thin film transistor 120, a second gate electrode 141 disposed on the second active layer 146 of the second thin film transistor 140, and a power wiring 161 disposed on the auxiliary layer 163, with the first gate insulating layer 170 interposed therebetween, respectively. The first conductive layer may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer may be a single layer or a multilayer.

A second gate insulating layer 180 is disposed on the first conductive layer. The second gate insulating layer 180 may be an interlayer insulating layer. The second gate insulating layer 180 may be formed of an inorganic insulating material such as silicon oxide, silicon nitride, silicon oxynitride, hafnium oxide, aluminum oxide, titanium oxide, tantalum oxide, zinc oxide and the like.

A second conductive layer is disposed on the second gate insulating layer 180. The second conductive layer includes a capacitor electrode 128 disposed on the first gate electrode 121, with the second gate insulating layer 180 interposed therebetween. The capacitor electrode 128 may form a storage capacitor in cooperation with the first gate electrode 121.

In the same way as the first conductive layer described above, the second conductive layer may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

An interlayer insulating layer 190 is disposed on the second conductive layer. The interlayer insulating layer 190 may be an interlayer insulating film. Further, the interlayer insulating layer 190 may perform a surface planarization function. The interlayer insulating layer 190 may include an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

A third conductive layer is disposed on the interlayer insulating layer 190. The third conductive layer includes a first drain electrode 123 and a first source electrode 124 of the first thin film transistor 120, a second drain electrode 143 and a second source electrode 144 of the second thin film transistor 140, and a power electrode 162 disposed on the power wiring 161.

The first source electrode 124 and the first drain electrode 123 may be electrically connected to the first active layer 126 through a first contact hole 129 passing through the interlayer insulating layer 190 and the second gate insulating layer 180. The second source electrode 144 and the second drain electrode 143 may be electrically connected to the second active layer 146 through a second contact hole 149 passing through the interlayer insulating layer 190 and the second gate insulating layer 180. The power electrode 162 may be electrically connected to the power wiring 161 through a third contact hole 169 passing through the interlayer insulating layer 190 and the second gate insulating layer 180.

The third conductive layer may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer may be a single layer or a multilayer. For example, the third conductive layer may have a stacked structure of Ti/Al/Ti, Mo/Al/Mo, Mo/AlGe/Mo, or Ti/Cu.

An insulating substrate layer 200 is disposed on the third conductive layer. The insulating substrate layer 200 may be formed of an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB). The surface of the insulating substrate layer 200 may be flat.

The insulating substrate layer 200 may include a plurality of banks 410 and 420. The plurality of banks 410 and 420 may be arranged to face each other, keeping a distance therebetween, inside each pixel PX, and the distanced banks 410 and 420, e.g., a first bank 410 and a second bank 420, may have the first electrode 210 and the second electrode 220 arranged respectively thereon. As shown in FIG. 1, three banks 410 and 420, i.e., two first banks 410 and one second bank 420, are arranged to be covered by the respective first and second electrodes 210 and 220 within one pixel PX. Although FIG. 2 shows only a cross section of one first bank 410 and one second bank 420 among them, the arrangement configuration thereof may be identically applicable to the other first bank 410 not shown in FIG. 2.

However, the number of banks 410 and 420 is not limited thereto. For example, it may be possible that more banks 410 and 420 are arranged in one pixel PX along with more first and second electrodes 210 and 220. The banks 410 and 420 may include at least one first bank 410 on which the first electrode 210 is arranged and at least one second bank 420 on which the second electrode 220 is arranged. In this case, the first and second banks 410 and 420 may be arranged to face each other keeping a distance therebetween such that the plurality of banks are alternately arranged in one direction. In some embodiments, it may be possible that two first banks 410 are arranged, keeping a distance therebetween, and one second bank 420 is arranged between the distanced first banks 410.

Furthermore, although not shown in FIG. 2, the first and second electrodes 210 and 220 may include the respective electrode stems 210S and 220S and the respective electrode branches 210B and 220B as described above. It may be understood in FIG. 2 that the first and second electrode branches 210B and 220B are respectively arranged on the first and second banks 410 and 420.

The plurality of banks 410 and 420 may be formed with the substantially same material in a single process. In this case, the banks 410 and 420 may form a grid pattern. The banks 410 and 420 may include polyimide.

Meanwhile, although not shown in the drawing, at least part of the plurality of banks 410 and 420 may be arranged on a boundary of the pixels PX to make them distinct. In this case, the electrodes 210 and 220 may not be disposed on the banks 410 and 420 disposed at the boundary of the pixel PX. Such banks may be arranged in a substantially grid pattern along with the aforementioned first and second banks 410 and 420. At least part of the banks 410 and 420 arranged on the boundary of the pixels PX may be formed to cover electrode lines of the display device 10.

The plurality of banks 410 and 420 may each have a structure protruding at least partially from the insulating substrate layer 200. The banks 410 and 420 may protrude upward from a flat plane on which the light emitting elements 300 are arranged, such that a protruding part may at least partially have slopes. The banks 410 and 420 having a protruded structure with slopes may have reflection layers 211 and 221 arranged thereon to reflect incident light. The light directed from the light emitting element 300 to the reflection layers 211 and 221 may be reflected to the outside of the display device 10, i.e., upward from the banks 410 and 420. The banks 410 and 420 with the protruded structure may not be limited in shape. Although it is shown in FIG. 2 that the banks have a shape with a flat top surface and angular corners, the present disclosure is not limited thereto, and the banks may be protruded to have round corners.

The plurality of banks 410 and 420 may have reflection layers 211 and 221 arranged thereon.

The first reflection layer 211 covers the first bank 410 and is partially electrically connected to the first drain electrode 123 of the first thin film transistor 120 via a fourth contact hole 319_1 penetrating the insulating substrate layer 200. The second reflection layer 221 covers the second bank 420 and is partially be electrically connected to the power electrode 162 via a fifth contact hole 319_2 penetrating the insulating substrate layer 200.

The first reflection layer 211 may be electrically connected to the first drain electrode 123 of the first thin film transistor 120 via the fourth contact hole 319_1 within the pixel PX. Accordingly, the first thin film transistor 120 may be arranged in an area overlapping the pixel PX. FIG. 1 shows electrical connection to the first thin film transistor 120 via the first electrode contact hole CNTD arranged on the first electrode stem 210S. That is, the first electrode contact hole CNTD may be the fourth contact hole 319_1.

The second reflection layer 221 may also be electrically connected to the power electrode 162 via the fifth contact hole 319_2 within the pixel PX. FIG. 2 shows that the second reflection layer 221 is connected through the fifth contact hole 319_2 within one pixel PX. FIG. 1 shows that the second electrode 220 of each pixel PX is electrically connected to the power wiring 161 via the plurality of second electrode contact holes CNTS on the second electrode stem 220S. That is, the second contact holes CNTS may be the fifth contact hole 319_2.

As described with reference to FIG. 1, the first and second contact holes CNTD and CNTS may be respectively arranged on the first and second electrode stems 210S and 220S. In this respect, FIG. 2 shows that, in the cross-sectional view of the display device 10, the first and second electrodes 210 and 220 are electrically connected to the first thin film transistor 120, or the power wiring 161, via the respective fourth and fifth contact holes 319_1 and 319_2, in an area separated from the banks 410 and 420 on which the first and second electrode branches 210B and 220B are arranged.

However, the present disclosure is not limited thereto. For example, in FIG. 1, the second electrode contact holes CNTS may be arranged at various positions on the second electrode stem 220S and, in some cases, on the second electrode branch 220B. In some embodiments, the second reflection layer 221 may also be connected to one second electrode contact hole CNTS, or the fifth contact hole 319_2, in an area out of one pixel PX.

In an area outside the emission area in which the pixels PX of the display device 100 are arranged, e.g., an outside area of the emission area, there may be a non-emission area in which no light emitting elements 300 are arranged. As described above, the second electrodes 220 of each pixel PX may be electrically connected via the second electrode stem 220S, so as to receive the same electrical signal.

In some embodiments, in the case of the second electrode 220, the second electrode stem 220S may be electrically connected to the power electrode 162 via one second electrode contact hole CNTS in the non-emission area as the outside area of the display device 10. Unlike the display device 10 of FIG. 1, because the second electrode stem 220S is arranged to extend to adjacent pixels and be electrically connected to each other even though the second electrode stem 220S is connected to the power electrode 162 via one contact hole, it may be possible to apply the same electrical signal to the second electrode branches 220B of the respective pixels PX. In the case of the second electrode 220 of the display device 10, the position of the contact hole for receiving an electrical signal from the power electrode 162 may vary according to the structure of the display device 10.

Meanwhile, with reference back to FIGS. 1 and 2, the reflection layers 211 and 221 may include a material having high reflectivity for reflecting the light emitted from the light emitting elements 300. For example, the reflection layers 211 and 221 may include, but are not limited to, a material such as silver (Ag) and copper (Cu).

The first and second reflection layers 211 and 221 may include first and second electrode layers 212 and 222 arranged respectively thereon.

The first electrode layer 212 may be arranged directly on the first reflection layer 211. The first electrode layer 212 may have a pattern substantially identical with that of the first reflection layer 211. The second electrode layer 222 may be arranged directly on the second reflection layer 221 to be spaced apart from the first electrode layer 212. The second electrode layer 222 may have a pattern that is substantially identical with that of the second reflection layer 221.

In an embodiment, the electrode layers 212 and 222 may cover the reflection layers 211 and 221 respectively thereneath. That is, the electrode layers 212 and 222 may be formed to be larger in size than the reflection layers 211 and 221 to cover the side end surfaces of the reflection layers 211 and 221. However, the present disclosure is not limited thereto.

The first and second electrode layers 212 and 222 may transfer, to contact electrodes 261 and 262 (to be described later), an electrical signal directed to the first and second reflection layers 211 and 221 connected to the first thin film transistor 120 or the power electrode 162. The electrode layers 212 and 222 may include a transparent conductive material. For example, the electrode layers 212 and 222 may include a material such as indium tin oxide (ITO), indium zinc oxide (IZO), and indium tin zinc oxide (ITZO), but are not limited thereto. In some embodiments, the reflective layers 211 and 221 and the electrode layers 212 and 222 may have a structure in which at least one transparent conductive layer such as ITO, IZO, or ITZO and at least one metal layer such as silver (Ag) or copper (Cu) are stacked. For example, the reflective layers 211 and 221 and the electrode layers 212 and 222 may have a stacked structure of ITO/Ag/ITO.

The first reflective layer 211 and the first electrode layer 212 disposed on the first bank 410 form the first electrode 210. The first electrode 210 may protrude to regions extending from both ends of the first bank 410, and accordingly, the first electrode 210 may contact the insulating substrate layer 200 in the protruding region. The second reflective layer 221 and the second electrode layer 222 disposed on the second bank 420 form the second electrode 220. The second electrode 220 may protrude to regions extending from both ends of the second bank 420, and accordingly, the second electrode 220 may contact the insulating substrate layer 200 in the protruding region.

The first and second electrodes 210 and 220 may be respectively arranged to cover the entire areas of the first and second banks 410 and 420. However, as described above, the first and second electrodes 210 and 220 are arranged to face each other keeping a distance therebetween. Between the electrodes, a first insulating material layer 510, which is to be described later, may be arranged, and the light emitting elements 300 may be arranged thereon.

In addition, the first reflective layer 211 may receive a driving voltage from the first thin film transistor 120 and the second reflective layer 221 may receive a source voltage from the power wiring 161. Thus, the first electrode 210 and the second electrode 220 receive the driving voltage and the source voltage, respectively. The first electrode 210 may be electrically connected to the first thin film transistor 120, and the second electrode 220 may be electrically connected to the power wiring 161. Accordingly, the first and second contact electrodes 261 and 262 arranged respectively on the first and second electrodes 210 and 220 may receive the driving voltage and source voltage. The driving voltage and the source voltage may be transferred to the light emitting elements 300 such that the light emitting elements 300 emit light with a predetermined electric current flowing therethrough.

The first insulating material layer 510 is arranged to partially cover the first and second electrodes 210 and 220. The first insulating material layer 510 may be arranged to mostly cover the top surfaces of the first and second electrodes 210 and 220 and partially expose the first and second electrodes 210 and 220. The first insulating material layer 510 may also be arranged in the space between the first and second electrodes 210 and 220. The first insulating material layer 510 may have an islet or line shape formed along the space between the first and second electrode branches 210B and 220B in plan view.

FIG. 2 shows that the first insulating material layer 510 is arranged in the space between one first electrode 210 (e.g., first electrode branch 210B) and one second electrode 220 (e.g., second electrode branch 220B). However, as described above, there may be a plurality of the first and second electrodes 210 and 220, such that the first insulating material layer 510 may be also arranged between one first electrode 210 and another second electrode 220 or between one second electrode 220 and another first electrode 210. The first insulating material layer 510 may be arranged to partially cover the side surfaces of the first and second electrodes 210 and 220 that are opposite to the side surfaces facing each other. That is, the first insulating material layer 510 may be arranged to expose center parts of the first and second electrodes 210 and 220.

On the first insulating material layer 510, the light emitting element 300 is arranged. The first insulating material layer 510 may be arranged between the light emitting element 300 and the insulating substrate layer 200. The first insulating material layer 510 may have a bottom surface contacting the insulating substrate layer 200, and the light emitting element 300 may be arranged on the top surface of the first insulating material layer 510. The first insulating material layer 510 may contact the electrodes 210 and 220 at both side surfaces thereof to electrically insulate the first and second electrodes 210 and 220 from each other.

The first insulating material layer 510 may overlap a partial area on the electrodes 210 and 220, e.g., part of the area protruding in a direction in which the first and second electrodes 210 and 220 face each other. The first insulating material layer 510 may also be arranged on the areas where the sloping surfaces and flat top surfaces of the banks 410 and 420 overlap the electrodes 210 and 220.

For example, the first insulating material layer 510 may cover the end parts protruding in the direction in which the first and second electrodes 210 and 220 face each other. The first insulating material layer 510 may contact the insulating substrate layer 200 partially on the bottom surface of the first insulating material layer 510, and may contact the electrodes 210 and 220 partially on the bottom surface of the first insulating material layer 510 and on the side surfaces thereof. Accordingly, the first insulating material layer 510 may protect regions overlapping the respective electrodes 210 and 220 and electrically insulate them. Further, the first insulating material layer 510 may prevent a first conductivity type semiconductor 310 and a second conductivity type semiconductor 320 of the light emitting element 300 from directly contacting other members, thereby preventing damage to the light emitting element 300.

However, the present disclosure is not limited thereto, and the first insulating material layer 510 may be arranged only on the areas overlapping the sloping side surfaces of the banks 410 and 420 in the areas on the first and second electrodes 210 and 220 in some embodiments. In this case, the bottom surface of the first insulating material layer 510 may terminate on the sloping side surfaces of the banks 410 and 420, and the electrodes 210 and 220 arranged on part of the sloping side surfaces of the banks 410 and 420 may be exposed to contact the contact electrodes 260.

The first insulating material layer 510 may also be arranged to expose both ends of the light emitting element 300. Accordingly, the contact electrodes 260 may contact the exposed top surfaces of the electrodes 210 and 220 and both ends of the light emitting element 300, and the contact electrode 260 may transfer the electrical signal applied to the first and second electrodes 210 and 220 to the light emitting element 300.

At least one light emitting element 300 may be disposed between the first electrode 210 and the second electrode 220. Although it is shown in FIG. 2 that one light emitting element 300 is arranged between the first and second electrodes 210 and 220, it is apparent that a plurality light emitting elements 300 may be arranged in a different direction (e.g., second direction D2) in plan view as shown in FIG. 1.

In detail, the light emitting element 300 may be electrically connected to the first electrode 210 at one end thereof and the second electrode 220 at the other end thereof. The both ends of the light emitting elements 300 may respectively contact the first and second contact electrodes 261 and 262.

Meanwhile, FIG. 1 exemplifies the case where only the light emitting elements 300 emitting the same color light are arranged in each pixel PX. However, the present disclosure is not limited thereto, and as described above, the light emitting elements 300 emitting light of different colors may be disposed together in one pixel PX.

The light emitting element 300 may be a light emitting diode. The light emitting element 300 may be a nanostructure mostly having a nano-size. The light emitting element 300 may be an inorganic light emitting diode made of an inorganic material. When the light emitting element 300 is an inorganic light emitting diode, a light emitting material having an inorganic crystal structure is disposed between two electrodes facing each other and an electric field is formed in a specific direction in the light emitting material. Then, the inorganic light emitting diode may be aligned between the two electrodes having a specific polarity.

In some embodiments, the light emitting element 300 may have a structure in which a first conductivity type semiconductor 310, an element active layer 330, a second conductivity type semiconductor 320, and an electrode material layer 370 are sequentially formed. The light emitting element 300 may be manufactured by depositing, horizontally, the first conductivity type semiconductor 310, the element active layer 330, and the second conductivity type semiconductor 320, and the electrode material layer 370 in the order on the insulating substrate layer 200. That is, the light emitting elements 300 formed by depositing the plurality of layers may be arranged in the widthwise direction parallel with the insulating substrate layer 200. However, the present disclosure is not limited thereto, and the light emitting elements 300 may be manufactured such that the layers are deposited in the reverse order between the first and second electrodes 210 and 220.

In addition, the light emitting element 300 may include a plurality of insulating layers 380 surrounding the outer circumferential surfaces of the formed members. The insulating layer 380 may include a first insulating layer 381 and a second insulating layer 382 disposed to surround the first insulating layer 381. The insulating layer 380 may protect the formed members, and at the same time, any one insulating layer may function to protect another insulating layer. For example, when manufacturing the light emitting element 300, the second insulating layer 382 may be disposed to surround the first insulating layer 381, and may include a material having an etch selectivity different from that of the first insulating layer 381, to protect the first insulating layer 381. Accordingly, damage to the first insulating layer 381 that may occur when the light emitting element 300 is manufactured can be prevented. A more detailed description will be given later.

The second insulating material layer 520 may be arranged to overlap at least part of the light emitting element 300. The second insulating material layer 520 may protect the light emitting element 300, and simultaneously fix the light emitting element 300 between the first and second electrodes 210 and 220.

Although it is shown in FIG. 2 that the second insulating material layer 520 is arranged only on the top surface of the light emitting element 300 in cross-sectional view, the second insulating material layer 520 may be arranged to surround the outer surface of the light emitting element 300. That is, like the first insulating material layer 510, the second insulating material layer 520 may be arranged to have an islet or line shape extending in the second direction D2 along the space between the first and second electrode branches 210B and 220B in plan view.

Part of the material of the second insulating material layer 520 may also be arranged at the area where the bottom surface of the light emitting element 300 and the first insulating material layer 510 overlap each other. That part may be formed when the light emitting element 300 is aligned on the first insulating layer 510, and then the second insulating material layer 520 is disposed thereon during the manufacture of the display device 10. That part may also be formed by the second insulating layer 520 partially permeating, during the formation of the second insulating layer 520, into pores formed in a section of the first insulating material layer 510 contacting the bottom surface of the light emitting element 300.

The second insulating material layer 520 may be arranged to expose both end surfaces of the light emitting element 300. That is, in cross-sectional view, the second insulating material layer 520 arranged on the top surface of the light emitting element 300 is shorter in length, measured in an axis direction than the light emitting element 300, such that the second insulating material layer 520 may be contracted inward in comparison with the both ends of the light emitting element 300. Accordingly, the first insulating material layer 510, the light emitting element 300, and the second insulating material layer 520 may be deposited such that the side surfaces thereof are aligned in a stepwise manner. This may facilitate contact between the contact electrodes 261 and 262 and both end surfaces of the light emitting element 300. However, the present disclosure is not limited thereto. The second insulating material layer 520 and the light emitting element 300 may have the same length, and both sides thereof may be aligned.

Meanwhile, the second insulating material layer 520 may be formed in a way of depositing the corresponding material on the first insulating material layer 510 and patterning the corresponding material in an area, e.g., area exposed for contact of the light emitting element 300 to the contact electrode 260. Patterning the second insulating material layer 520 may be performed with a conventional dry etching or wet etching process. Here, the first and second insulating material layers 510 and 520 may include materials different in etch selectivity to prevent the first insulating material layer 510 from being patterned. That is, the first insulating material layer 510 may serve as an etching stopper in patterning the second insulating material layer 520.

Accordingly, the first insulating material layer 510 may not undergo material damage even when the second insulating material layer 520 covering the outer surface of the light emitting element 300 is patterned to expose the both ends of the light emitting element 300. In particular, the first insulating material layer 510 and the light emitting element 300 may have smooth contact surfaces at the both ends of the light emitting element 300, where the light emitting element 300 and the contact electrode 260 contact each other.

On the second insulating material layer 520, the first contact electrode 261 disposed on the first electrode 210 and overlapping at least part of the second insulating material layer 520, and the second contact electrode 262 disposed on the second electrode 220 and overlapping at least part of the second insulating material layer 520, may be arranged.

The first and second contact electrodes 261 and 262 may be respectively arranged on the top surfaces of the first and second electrodes 210 and 220. In detail, the first and second contact electrodes 261 and 262 may respectively contact the first and second electrode layers 212 and 222 in the area where the first insulating material layer 510 is patterned to expose parts of the first and second electrodes 210 and 220. The first and second contact electrodes 261 and 262 may contact one end side of the light emitting element 300, e.g., the first conductivity type semiconductor 310, the second conductivity type semiconductor 320, or the electrode material layer 370. Accordingly, the first and second contact electrodes 261 and 262 may transfer the electrical signal applied to the first and second electrode layers 212 and 222 to the light emitting element 300.

The first contact electrode 261 may be arranged on the first electrode 210 to cover the first electrode 210 in part and contact the light emitting element 300 and the first and second insulating material layers 510 and 520 in part, on the bottom surface of the first contact electrode 261. One end of the first contact electrode 261 that is oriented to the second contact electrode 262 is arranged on the second insulating material layer 520. The second contact electrode 262 may be arranged on the first electrode 210 to cover the second electrode 220 in part and contact the light emitting element 300, the first insulating material layer 510, and a third insulating material layer 530 in part on the bottom surface of the second contact electrode 262. One end of the second contact electrode 262 that is oriented to the first contact electrode 261 is arranged on the third insulating material layer 530.

The first and second insulating material layers 510 and 520 may be patterned into an area to cover the first and second electrodes 210 and 220 on the top surface of the first and second banks 410 and 420. Accordingly, the first and second electrode layers 212 and 222 of the respective first and second electrodes 210 and 220 may be exposed to be electrically connected to the respective contact electrodes 261 and 262.

The first contact electrode 261 and the second contact electrode 262 may be spaced apart from each other on the second insulating material layer 520 or the third insulating material layer 530. That is, the first and second contact electrode 261 and 262 may be arranged to contact the light emitting element 300 and the second insulating material layer 520, or the third insulating material layers 530, together and, on the second insulating material layer 520, to be spaced apart in the deposition direction for electrical insulation. Accordingly, the first and second contact electrodes 261 and 262 may respectively receive different powers from the first thin film transistor 120 and the power wiring 161. For example, the first contact electrode 261 may receive a driving voltage applied from the first thin film transistor 120 to the first electrode 210, and the second contact electrode 262 may receive a common source voltage applied from the power wiring 161 to the second electrode 220. However, the present disclosure is not limited thereto.

The contact electrodes 261 and 262 may include a conductive material. For example, they may include ITO, IZO, ITZO, aluminum (Al), or the like. However, the present disclosure is not limited thereto.

Further, the contact electrodes 261 and 262 may include the same material as the electrode layers 212 and 222. The contact electrodes 261 and 262 may be arranged to have substantially the same pattern on the electrode layers 212 and 222, to contact the electrode layers 212 and 222. For example, the first and second contact electrodes 261 and 262 contacting the first and second electrode layers 212 and 222 may transfer the electrical signals applied to the first and second electrode layers 212 and 222 to the light emitting element 300.

The third insulating material layer 530 may be arranged on the first contact electrode 261 to electrically insulate the first and second contact electrodes 261 and 262 from each other. The third insulating material layer 530 may be arranged to cover the first contact electrode 261, and not to overlap an area of the light emitting element 300 such that the light emitting element 300 contacts the second contact electrode 262. The third insulating material layer 530 may partially contact the first contact electrode 261, the second contact electrode 262, and the second insulating material layer 520 on the top surface of the second insulating material layer 520. The third insulating material layer 530 may be disposed to cover one end of the first contact electrode 261 on the top surface of the second insulating material layer 520. Accordingly, the third insulating material layer 530 may protect the first contact electrode 261, and electrically insulate the first contact electrode 261 from the second contact electrode 262.

One end of the third insulating material layer 530 that is oriented to the second electrode 220 may be aligned with one side surface of the second insulating material layer 520.

Meanwhile, in some embodiments, the third insulating material layer 530 may be omitted in the display device 10. Accordingly, the first contact electrode 261 and the second contact electrode 262 may be disposed on substantially the same plane, and may be electrically insulated from each other by a passivation layer 550 to be described later.

The passivation layer 550 may be formed on the third insulating material layer 530 and the second contact electrode 262 to protect members disposed on the insulating substrate layer 200 against the external environment. When the first contact electrode 261 and the second contact electrode 262 are exposed, a problem of disconnection of the contact electrode material may occur due to electrode damage, so it is required to cover them with the passivation layer 550. That is, the passivation layer 550 may be disposed to cover the first electrode 210, the second electrode 220, the light emitting element 300, and the like. In addition, as described above, when the third insulating material layer 530 is omitted, the passivation layer 550 may be formed on the first contact electrode 261 and the second contact electrode 262. In this case, the passivation layer 550 may electrically insulate the first contact electrode 261 and the second contact electrode 262 from each other.

Each of the above-described first insulating material layer 510, second insulating material layer 520, third insulating material layer 530, and passivation layer 550 may include an inorganic insulating material. For example, the first insulating material layer 510, the second insulating material layer 520, the third insulating material layer 530, and the passivation layer 550 may include a material such as silicon oxide (SiOx), silicon nitride (SiNx), silicon oxynitride (SiOxNy), aluminum oxide ($Al_2O_3$), aluminum nitride (AlN), and the like. The first insulating material layer 510, the second insulating material layer 520, the third insulating material layer 530, and the passivation layer 550 may be made of the same material, but may also be made of different materials. In addition, various materials that impart insulating properties to the first insulating material layer 510, the second insulating material layer 520, the third insulating material layer 530, and the passivation layer 550 are applicable.

Meanwhile, the first and second insulating material layers 510 and 520 may differ in etch selectivity as described above. As one example, when the first insulating material layer 510 includes silicon oxide (SiOx), the second insulating material layer 520 may include silicon nitride (SiNx). As another example, when the first insulating material layer 510 includes silicon nitride (SiNx), the second insulating material layer 520 may include silicon oxide (SiOx). However, the present disclosure is not limited thereto.

Meanwhile, the light emitting element 300 may be manufactured on a substrate by epitaxial growth. A seed crystal layer for forming a semiconductor layer may be formed on the substrate, and a desired semiconductor material may be deposited to grow. Hereinafter, the structure of the light emitting element 300 according to various embodiments will be described in detail with reference to FIG. 3.

Figure 3:
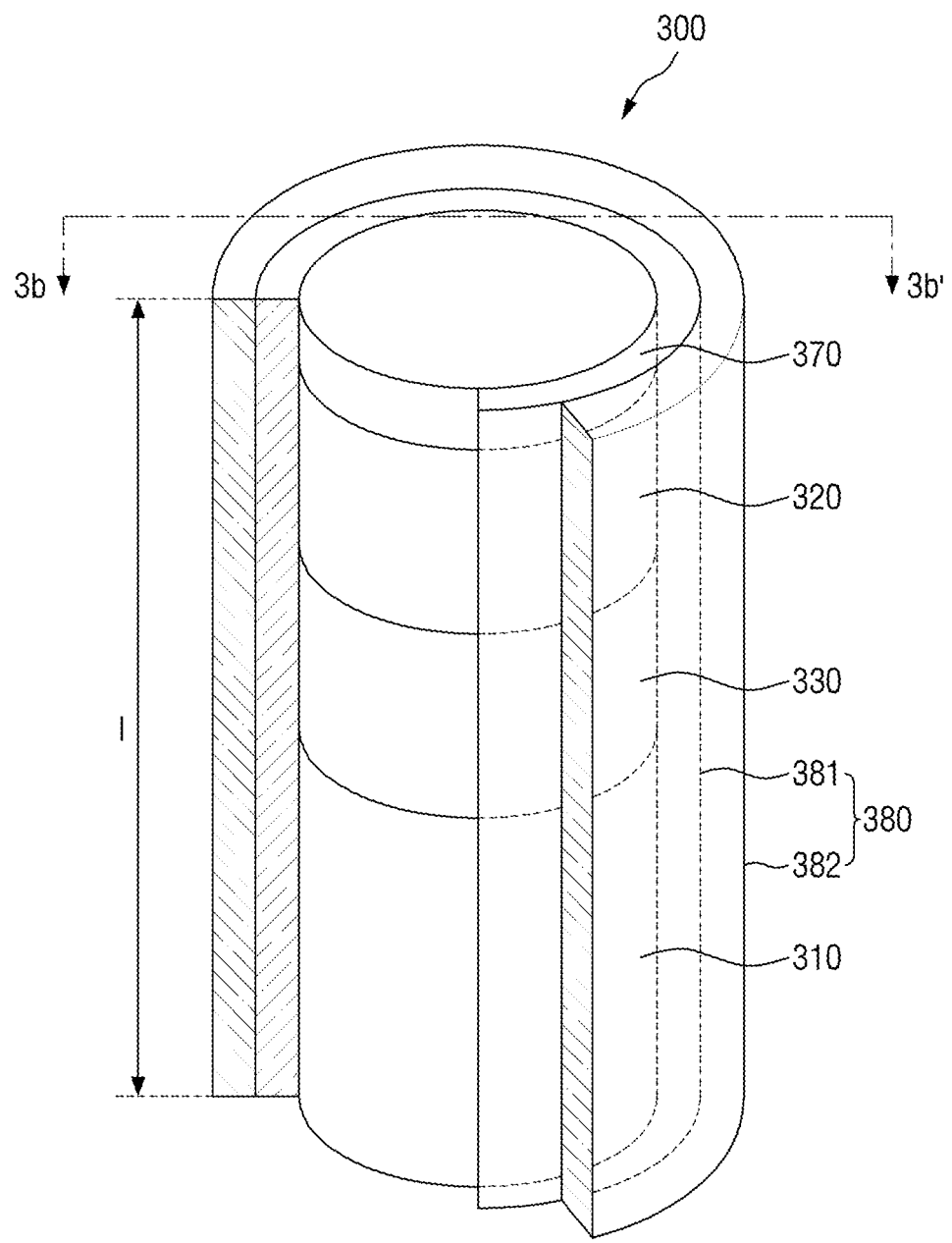
FIG. 3 is a schematic view of a light emitting element according to an embodiment.
Figure 4:
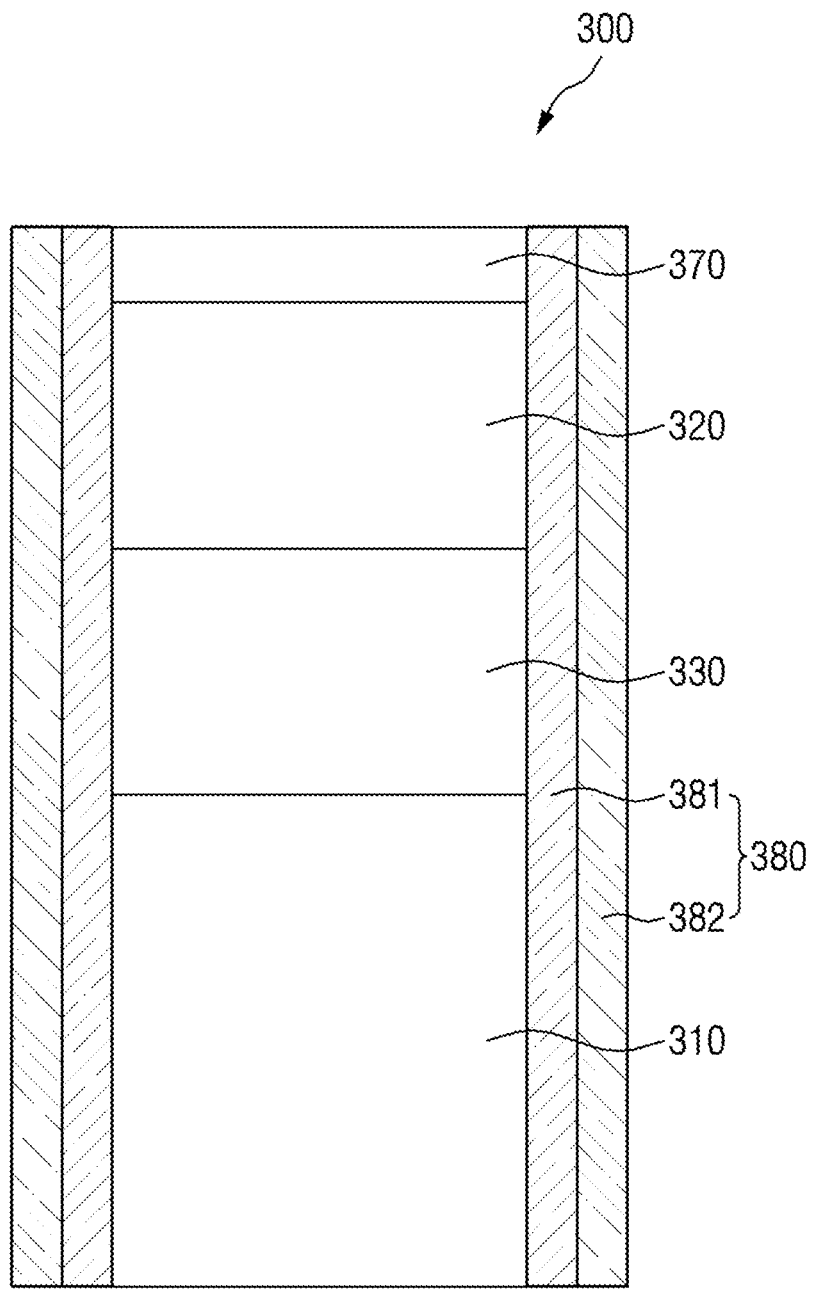
FIG. 4 is a cross-sectional view taken along line 3b-3b' of FIG. 3A.

FIG. 3 is a schematic view of a light emitting element according to an embodiment. FIG. 4 is a cross-sectional view taken along line 3b-3b' of FIG. 3.

Referring to FIG. 3, the light emitting element 300 may include a plurality of conductivity type semiconductors 310 and 320, an element active layer 330, an electrode material layer 370, and a plurality of insulating layers 380. The electrical signal received through the first and second electrodes 210 and 220 may be transferred to the element active layer 330 via the plurality of conductivity type semiconductors 310 and 320 to emit light.

In detail, the light emitting element 300 may include the first conductivity type semiconductor 310, the second conductivity type semiconductor 320, the element active layer 330 arranged between the first and second conductivity type semiconductors 310 and 320, the electrode material layer 370 arranged on the second conductivity type semiconductor 320, and a plurality of insulating layers 380 disposed to surround outer circumferential surfaces thereof. The plurality of insulating layers 380 may include the first insulating layer 381 in contact with the first conductivity type semiconductor 310, the second conductivity type semiconductor 320, the element active layer 330, and the electrode material layer 370 to surround outer circumferential surfaces thereof, and the second insulating layer 382 surrounding the first insulating layer 381. Although it is shown in FIG. 3 that the light emitting element 300 has a structure in which the first conductivity type semiconductor 310, the element active layer 330, the second conductivity type semiconductor 320, and the electrode material layer 370 are formed in order in the lengthwise direction thereof, the present disclosure is not limited thereto. The electrode material layer 370 may be omitted and, in some embodiments, it may be arranged on at least one of both side surfaces of each of the first and second conductivity type semiconductor 310 and 320. Hereinafter, a description is made of the exemplary light emitting element 300 of FIG. 3, and it is obvious that the following description of the light emitting element 300 is identically applicable to light emitting elements 300 including different structures.

The first conductivity type semiconductor 310 may be an n-type semiconductor layer. As one example, when the light emitting element 300 emits light of a blue wavelength band, the first conductivity type semiconductor 310 may include a semiconductor material having a chemical formula of $In_xAl_yGa_{1-x-y}N$ ($0 \leq x \leq 1$, $0 \leq y \leq 1$, $0 \leq x+y \leq 1$). For example, it may be any one or more of n-type doped InAlGaN, GaN, AlGaN, InGaN, AlN and InN. The first conductivity type semiconductor 310 may be doped with a first conductive dopant. For example, the first conductive dopant may be Si, Ge, Sn, or the like. The length of the first conductivity type semiconductor 310 may have a range of 1.5 μm to 5 μm, but is not limited thereto.

The second conductivity type semiconductor 320 may be a p-type semiconductor layer. As one example, when the light emitting element 300 emits light of a blue wavelength band, the second conductivity type semiconductor 320 may include a semiconductor material having a chemical formula of $In_xAl_yGa_{1-x-y}N$ ($0 \leq x \leq 1$, $0 \leq x+y \leq 1$). For example, it may be any one or more of p-type doped InAlGaN, GaN, AlGaN, InGaN, AlN and InN. The second conductivity type semiconductor 320 may be doped with a second conductive dopant. For example, the second conductive dopant may be Mg, Zn, Ca, Se, Ba, or the like. The length of the second conductivity type semiconductor 320 may have a range of 0.08 μm to 0.25 μm, but is not limited thereto.

The element active layer 330 is disposed between the first conductivity type semiconductor 310 and the second conductivity type semiconductor 320, and may include a material having a single or multiple quantum well structure. When the element active layer 330 includes a material having a multiple quantum well structure, a plurality of quantum layers and well layers may be stacked alternately. The element active layer 330 may emit light by coupling of electron-hole pairs according to an electric signal applied through the first conductivity type semiconductor 310 and the second conductivity type semiconductor 320. For example, when the element active layer 330 emits light of a blue wavelength band, it may include a material such as AlGaN or AlInGaN. In particular, when the element active layer 330 has a multiple quantum well structure, in which quantum layers and well layers may be stacked alternately, the quantum layer may include a material such as AlGaN or AlInGaN, and the well layer may include a material such as GaN or AlGaN. However, the present disclosure is not limited thereto, and the element active layer 330 may have a structure, in which semiconductor materials having large band gap energy and semiconductor materials having small band gap energy are alternately stacked, and may include other Group III to V semiconductor materials according to the wavelength band of the emitted light. The light emitted by the element active layer 330 is not limited to light of a blue wavelength band, but may also be light of a red or green wavelength band in some cases. The length of the element active layer 330 may have a range of 0.05 μm to 0.25 μm, but is not limited thereto.

The light emitted from the element active layer 330 may be projected through both side surfaces, as well as the outer surface of the light emitting element 300 in a longitudinal direction. The directionality of light emitted from the element active layer 330 is not limited to one direction.

The electrode material layer 370 may be an ohmic contact electrode. However, the present disclosure is not limited thereto, and the electrode material layer 370 may be a Schottky contact electrode. The electrode material layer 370 may include conductive metal. For example, the electrode material layer 370 may include at least one of aluminum (Al), titanium (Ti), indium (In), gold (Au), or silver (Ag). The electrode material layer 370 may include the same material or different materials. However, the present disclosure is not limited thereto.

The first insulating layer 381 may be formed on the outside of the first conductivity type semiconductor 310, the second conductivity type semiconductor 320, the element active layer 330, and the electrode material layer 370, and may function to protect them. For example, the first insulating material layer 381 may be formed to surround the side surfaces of the above-mentioned members, and may not be formed at both ends of the light emitting element 300 in the longitudinal direction, e.g., at both ends where the first conductivity type semiconductor 310 and the electrode material layer 370 are disposed. However, the present disclosure is not limited thereto.

The first insulating material layer 381 may include materials having insulating properties, for example, silicon oxide (SiOx), silicon nitride (SiNx), silicon oxynitride (SiOxNy), aluminum nitride (AlN), aluminum oxide ($A_2O_3$), and the like. Accordingly, an electrical short circuit that may occur when the element active layer 330 directly contacts the first electrode 210 or the second electrode 220 can be prevented. Furthermore, the first insulating material layer 381 covers the element active layer 330 to protect the outer circumferential surface of the light emitting element 300, which may prevent degradation in light emission efficiency.

Although it is illustrated in the drawing that the first insulating layer 381 is formed to extend in the longitudinal direction to cover the first conductivity type semiconductor 310 to the electrode material layer 370, the present disclosure is not limited thereto. The first insulating material layer 381 may cover only the first conductivity type semiconductor 310, the element active layer 330, and the second conductivity type semiconductor 320, or only part of the outer surface of the electrode material layer 370, and expose part of the outer surface of the electrode material layer 370.

The thickness of the first insulating material layer 381 may have a range of 0.5 μm to 1.5 μm, but is not limited thereto.

The second insulating layer 382 may be disposed to surround the outer circumferential surface of the first insulating layer 381, and the second insulating layer 382 may have substantially the same shape as the first insulating layer 381. The second insulating layer 382 includes a material having an etch selectivity different from that of the first insulating layer 381, thereby preventing damage to the first insulating layer 381 that may occur in an etching or separation step in the manufacture of the light emitting element 300. Thus, it is possible to perform a function of protecting the first insulating layer 381. For example, when the etchant for separation includes fluorine (F), the etch selectivity of the second insulating layer 382 for the etchant for separation may be greater than the etch selectivity of the first insulating layer 381 for the etchant for separation.

The process of manufacturing the light emitting element 300 may include forming the first insulating layer 381 on the element grown on the substrate, and then separating the element by a chemical lift off (CLO) method. Here, the first insulating layer 381 may be partially damaged by the etchant used for separating the element. In order to prevent this, the second insulating layer 382 may be formed to surround the outer circumferential surface of the first insulating layer 381, to prevent the first insulating layer 381 from being damaged by the etchant for separation. Since the second insulating layer 382 may include a material having an etch selectivity different from that of the first insulating layer 381, the second insulating layer 382 may not be etched by the etchant for separation, and the element grown on the substrate may be separated.

According to an embodiment, the second insulating material layer 382 may include materials having insulating properties and an etch selectivity different from that of the first insulating material layer 381, for example, silicon oxide (SiOx), silicon nitride (SiNx), silicon oxynitride (SiOxNy), aluminum nitride (AlN), aluminum oxide ($A_2O_3$), and the like.

When the first insulating layer 381 includes aluminum oxide ($A_2O_3$), the second insulating layer 382 may include silicon nitride (SiNx). However, the present disclosure is not limited thereto. Accordingly, when manufacturing the light emitting element 300, the second insulating layer 382 may prevent damage to the first insulating layer 381. The first insulating layer 381 may have a substantially constant thickness in a long axis direction, crossing both ends of the light emitting element 300.

The thickness of the second insulating material layer 382 may have a range of 0.5 µm to 1.5 µm, but is not limited thereto.

Further, in some embodiments, the second insulating material layer 382 may have an outer circumferential surface which is surface-treated. As described above, when the light emitting elements 300 are aligned between the electrodes 210 and 220, the plurality of light emitting elements 300 may be applied in a dispersed state in a solution. Here, in order to keep the light emitting elements 300 in a dispersed state without aggregation with other light emitting elements 300 adjacent in the solution, the surface of the second insulating layer 382 may be treated in a hydrophobic or hydrophilic manner, such that it can maintain a mutually dispersed state in the solution. Accordingly, when the light emitting elements 300 are aligned, they may be aligned without aggregation, between the first electrode 210 and the second electrode 220.

The light emitting element 300 may have a cylindrical shape. As shown in FIG. 4, the cross section taken by halving the light emitting element 300 in the lengthwise direction crossing the two ends of the light emitting element 300 may have a rectangular shape. However, the shape of the light emitting element 300 is not limited thereto, and may have various shapes such as a regular cube, a rectangular parallelepiped and a hexagonal prism. The light emitting element 300 may have a length I of 1 µm to 10 µm or 2 µm to 5 µm, and preferably about 4 µm. In addition, the diameter of the light emitting element 300 may have a range of 400 nm to 700 nm, and preferably may be about 500 nm.

Although the following description is made of the exemplary light emitting element 300 shown in FIG. 3 for convenience of explanation, the present disclosure may be identically applicable to the light emitting elements including more electrode material layers 370 or other structures.

Figure 5:
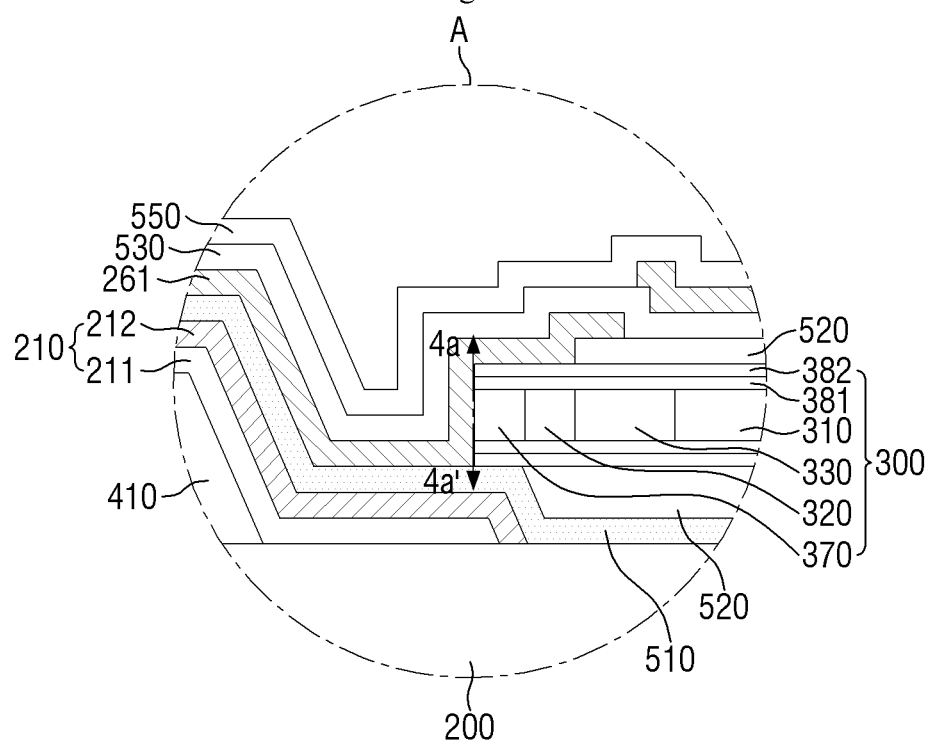
FIG. 5 is an enlarged view of part A of FIG. 2.

Meanwhile, FIG. 5 is an enlarged view of part A of FIG. 2.

Referring to FIG. 5, in the light emitting element 300, in cross-sectional view crossing both ends thereof, the first conductivity type semiconductor 310, the element active layer 330, the second conductivity type semiconductor 320, and the electrode material layer 370 may be formed in a horizontal direction with the insulating substrate layer 200, and the first insulating layer 381 and the second insulating layer 382 may be formed in a direction perpendicular to the insulating substrate layer 200. That is, the light emitting element 300 may be disposed on the insulating substrate layer 200 to be perpendicular to the direction in which the above-mentioned members are formed.

As described above, when manufacturing the light emitting element 300, since the first insulating layer 381 is protected without being damaged by the second insulating layer 382, the outer circumferential surface of the light emitting element 300 may form a smooth surface, and the element active layer 330 may be prevented from contacting other members by the first insulating layer 381 and the second insulating layer 382. That is, the first insulating layer 381 may have a substantially constant thickness in a long axis direction crossing both ends of the light emitting element 300.

In addition, when manufacturing the light emitting element 300, it can be separated while preventing the outer surface of the light emitting element 300 from being damaged by the second insulating layer 382, so that both end surfaces of the light emitting element 300 can form smooth surfaces and can have a relatively low roughness. Accordingly, the first conductivity type semiconductor 310 of the light emitting element 300 may be formed to have a smooth surface, which prevents an open circuit problem from occurring when contacting the first contact electrode 261.

On the plane (indicated by line 4a-4a' in FIG. 5) where one end surface of the light emitting element 300 and the first contact electrode 261 are in contact, the end surface of the light emitting element 300 is smooth, thereby preventing a disconnection problem in which the electrode material of the first contact electrode 261 is cut off. For example, if the end surface of the light emitting element 300 is rough or protruded, or recessed to form a slope, this may degrade the thin film step coverage of the contact electrode material when the first contact electrode 261 and the light emitting element 300 are in contact, which leads to a partial cutoff of the electrode material. That is, the faulty contact between the light emitting element 300 and the first contact electrode 261 at the contact area (4a-4a' of FIG. 5) may block an electrical signal from reaching the light emitting element 300, leading to a light emission error.

Meanwhile, if the end surface of the light emitting element 300 is smooth as shown in FIG. 5, this makes it possible to prevent a disconnection problem of the contact electrode material from occurring at the area (4a-4a' of FIG. 5) where the light emitting element 300 and the contact electrode 260 contact each other. This may be able to improve reliability of the light emitting element 300 of the display device 10. According to an embodiment, the end surface of the light emitting element 300 may have a roughness value of 8 nm Ra to 12 nm Ra. However, the present disclosure is not limited thereto. Meanwhile, although not shown in the drawing, the above-described approach may be identically applicable to the second conductivity type semiconductor 320, contacting the second contact electrode 262 or the side surface formed by the electrode material layer 370.

The smooth end surface of the light emitting element 300 may be formed by a chemical lift off (CLO) method in which the light emitting element 300 chemically removes and separates the separating layer 1300 (see FIG. 8) when the light emitting element 300 is manufactured. That is, the light emitting element 300 may be separated from the lower substrate layer without any external physical force, by letting the material grown on the end surface of the light emitting element 300 be cut off by removing the separating layer 1300 on which the light emitting element 300 was grown.

Here, when manufacturing the light emitting element 300 by the chemical lift off (CLO) method, the second insulating layer 382 may be formed so as not to damage the outer circumferential surface of the light emitting element 300. The second insulating layer 382 may include a material that is not etched by the etchant for separation used when removing the separating layer 1300. Accordingly, even if the light emitting element 300 is manufactured by the chemical lift off (CLO) method, the light emitting element 300 according to an embodiment can prevent damage to the outer circumferential surface thereof. At the same time, a smooth surface can be formed such that both end surfaces of the light emitting element 300 are flat, and a disconnection problem of the materials of the contact electrodes 261 and 262 as described above can be prevented.

A description is made hereinafter of the method for manufacturing the light emitting element 300 in detail with reference to FIGS. 6 to 16.

FIGS. 6 to 16 are schematic cross-sectional views schematically showing a method for manufacturing a light emitting element according to an embodiment.

Figure 6:
FIGS. 6 to 16 are schematic cross-sectional views schematically showing a method for manufacturing a light emitting element according to an embodiment.

First, with reference to FIG. 6, a lower substrate layer 1000 including a base substrate 1100 and a buffer material layer 1200 formed on the base substrate 1100 is prepared. As shown in FIG. 6, the lower substrate layer 1000 may have a layered structure formed by depositing the base substrate 1100 and the buffer material layer 1200 in order.

The base substrate 1100 may include a transparent substrate such as a sapphire ($Al_2O_3$) substrate and a glass substrate. However, the present disclosure is not limited thereto, and it may be formed of a conductive substrate material such as GaN, SiC, ZnO, Si, GaP and GaAs. The following description is directed to an exemplary case where the base substrate 1100 is a sapphire ($Al_2O_3$) substrate. Although not limited, the base substrate 1100 may have, for example, a thickness in the range of 400 μm to 1500 μm.

On the base substrate 1100, a plurality of conductivity type semiconductor layers are formed. The plurality of conductivity type semiconductor layers grown by an epitaxial growth method may be grown by forming a seed crystal and depositing a crystal material thereon. Here, the conductivity type semiconductor layer may be formed using one of electron beam deposition, physical vapor deposition (PVD), chemical vapor deposition (CVD), plasma laser deposition (PLD), dual-type thermal evaporation, sputtering, and metal organic chemical vapor deposition (MOCVD), preferably, using the metal organic chemical vapor deposition (MOCVD). However, the present disclosure is not limited thereto.

Typically, a precursor material for forming the plurality of conductivity type semiconductor layers may be selected to form a target material in a typically selectable range without any limitation. For example, the precursor material may be a metal precursor including an alkyl group such as a methyl group or an ethyl group. Examples of the precursor material may include, but are not limited to, trimethylgallium $Ga(CH_3)_3$, trimethylaluminum $Al(CH_3)_3$, and triethyl phosphate $(C_2H_5)_3PO_4$. Hereinafter, with the omission of the description of the method and processing conditions for forming the plurality of conductivity type semiconductor layers, a description is made of the processing order of the method for manufacturing the light emitting element 300 and the layered structure of the light emitting element 300 in detail.

A buffer material layer 1200 is formed on the base substrate 1100. Although it is shown in the drawing that one buffer material layer 1200 is deposited, the present disclosure is not limited thereto, and a plurality of layers may be formed.

At a step to be described later, a separating layer 1300 may be disposed on the buffer material layer 1200 and then a crystal for the first conductivity type semiconductor layer 3100 may grow on the separating layer 1300. The buffer material layer 1200 may be interposed between the base substrate 1100 and the separating layer 1300 to reduce a grid constant difference of the first conductivity type semiconductor layer 3100. Although the first conductivity type semiconductor layer 3100 may be directly formed on the separating layer 1300 disposed on the base substrate 1100, the buffer material layer 1200 may provide the seed crystal to facilitate crystal growth to the first conductivity type semiconductor layer 3100.

For example, the buffer material layer 1200 may include an undoped semiconductor, and may be a material including substantially the same material as the first conductivity type semiconductor layer 3100 that is neither n-type doped nor p-type doped. In an exemplary embodiment, the buffer material layer 1200 may be, but is not limited to, at least one of undoped InAlGaN, GaN, AlGaN, InGaN, AlN, or InN.

Meanwhile, in some embodiments, a plurality of layers may be formed on the buffer material layer 1200, and the separating layer 1300 may be deposed thereon. The buffer material layer 1200 may also be omitted depending on the base substrate 1100. A detailed description thereof will be given with reference to other embodiments. Hereinafter, a description is made of the exemplary case where the buffer material layer 1200 including an undoped semiconductor material is formed on the base substrate 1100.

Figure 7:
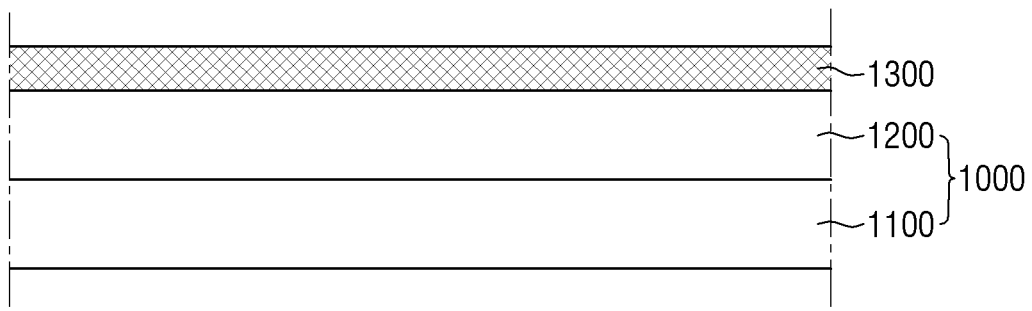

Next, with reference to FIG. 7, the separating layer 1300 is formed on the lower substrate layer 1000.

The separating layer 1300 may have the first conductivity type semiconductor layer 3100 formed thereon. That is, the separating layer 1300 may be interposed between the first conductivity type semiconductor layer 3100 and the buffer material layer 1200, and the separating layer 1300 may include a material facilitating growth of the crystal of the first conductivity type semiconductor layer 3100. The separating layer 1300 may include at least one of an insulating material or a conductive material. As one example, the separating layer 1300 may include silicon oxide (SiOx), silicon nitride (SiNx), silicon oxynitride (SiOxNy) or the like as an insulating material, and may include ITO, IZO, IGO, ZnO, graphene, graphene oxide or the like as a conductive material. However, the present disclosure is not limited thereto.

The separating layer 1300 may be etched and removed at a step to be described later, thereby performing a function of separating the light emitting element 300 from the lower substrate layer 1000. Removing the separating layer 1300 may be performed by the chemical lift off (CLO) method as described above, so that the end surface of the light emitting element 300 may be formed substantially the same as the surface of the separating layer 1300. That is, the end surface of the light emitting element 300 may have a flat surface.

The separating layer 1300 may also serve as an etching stopper between a semiconductor structure 3000 and the buffer material layer 1200 during the process of etching the semiconductor structure 3000. That is, when the semiconductor structure 3000 is etched, the separating layer 1300 may be patterned simultaneously in one process, or patterned separately in a different process. There is no limitation on the method of manufacturing the light emitting element 300.

However, the present disclosure is not limited thereto, and more separating layers 1300 may be arranged in the semiconductor structure 3000 or the lower substrate layer 1000, and regions such as on the interface between the buffer material layer 1200 and the first conductivity type semiconductor layer 1300.

Figure 8:
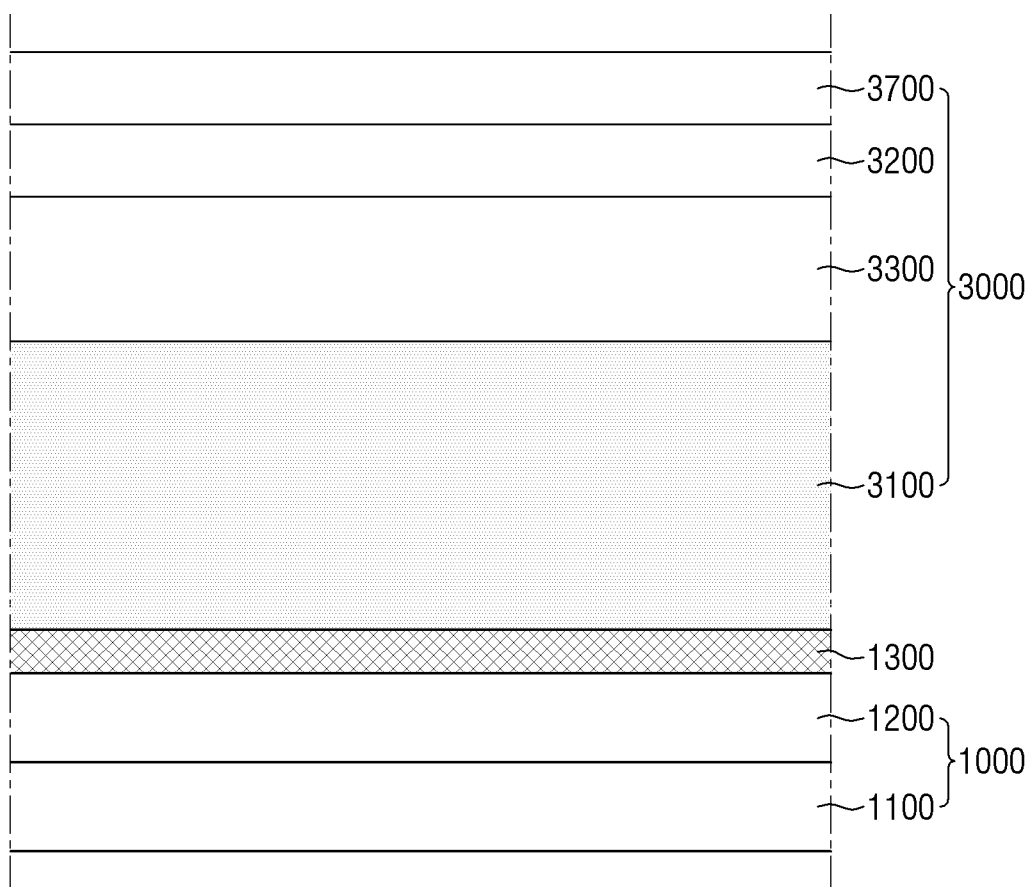

Next, with reference to FIG. 8, the semiconductor structure 3000 is formed by forming a first conductivity type semiconductor layer 3100, an active material layer 3300, a second conductivity type semiconductor layer 3200, and a conductive electrode material layer 3700 in order on the separating layer 1300.

The semiconductor structure 3000 may be partially etched at a step to be described later to form an element rod (ROD). The plurality of material layers included in the semiconductor structure 3000 may be formed through a conventional process as described above. On the separating layer 1300, the first conductivity type semiconductor layer 3100, the active material layer 3300, the second conductivity type semiconductor layer 3200, and the conductive electrode material layer 3700 may be deposited in order, and they may respectively include the same materials as those of the first conductivity type semiconductor 310, the element active layer 330, the second conductivity type semiconductor 320, and the electrode material layer 370 of the light emitting element 300.

Meanwhile, the light emitting element 300 may be manufactured with the omission of the electrode material layer 370, or with the further inclusion of a different electrode material layer 370 formed on the bottom surface of the first conductivity type semiconductor 310. In other words, unlike FIG. 8, in the semiconductor structure 3000, the conductive electrode material layer 3700 may be omitted, or another conductive electrode material layer may be formed below the first conductivity type semiconductor layer 3100. The following description is made of the exemplary case where the semiconductor structure 3000 includes the conductive electrode material layer 3700.

Figure 9:
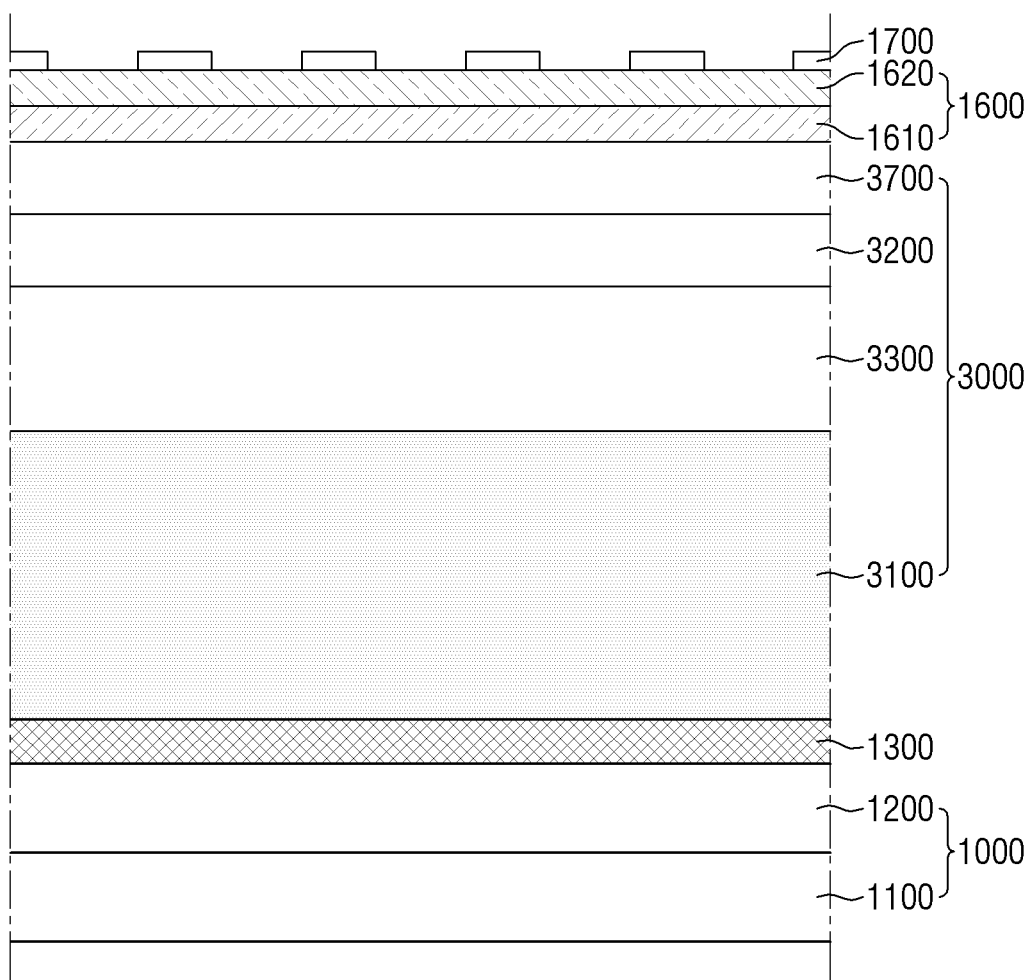
Figure 10:
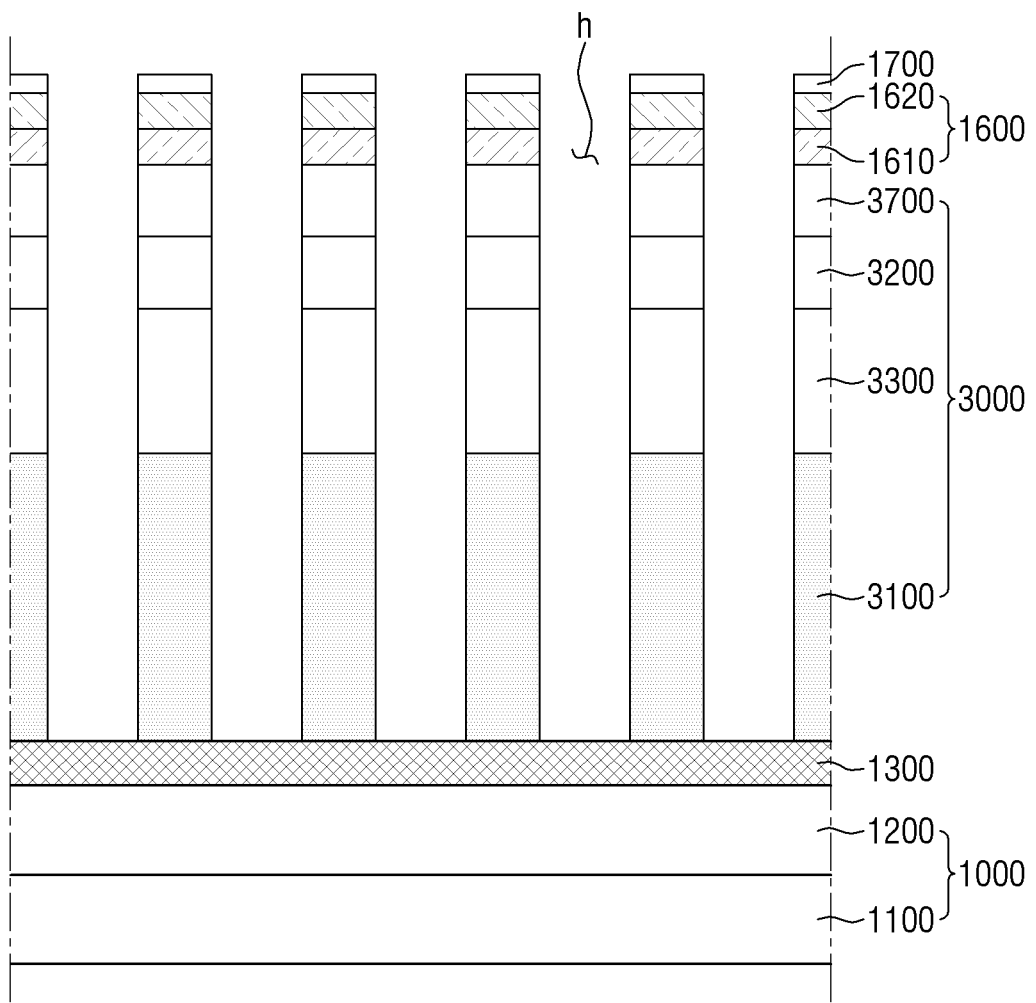
Figure 11:
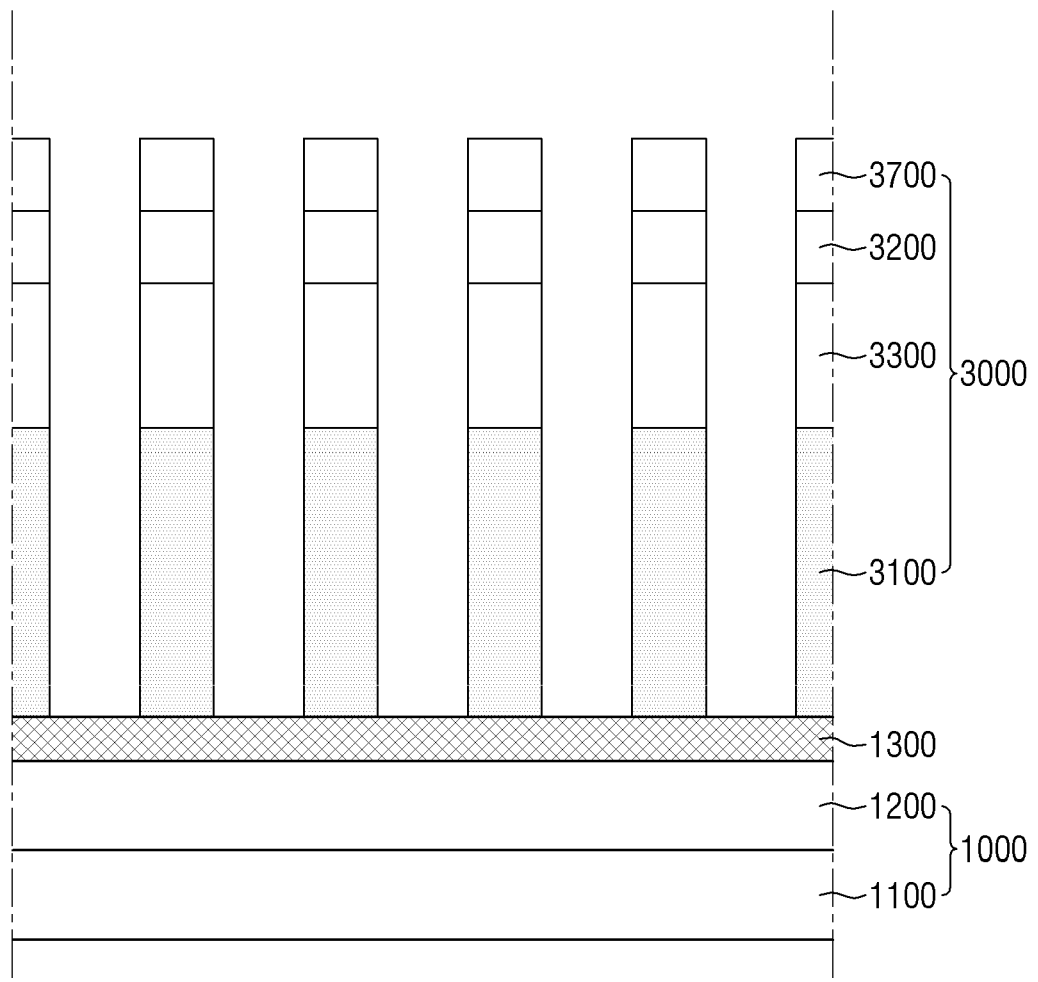

Next, referring to FIGS. 9 to 11, the element rod (ROD) is formed by etching the first conductivity type semiconductor layer 3100, the active material layer 3300, the second conductivity type semiconductor layer 3200, and the electrode material layer 3700 in a direction perpendicular to the lower substrate layer 1000.

First, with reference to FIGS. 9 and 10, forming the element rod ROD by vertically etching the semiconductor structure 3000 may include a patterning process that may be conventionally carried out. For example, forming the element rod ROD by etching the semiconductor structure 3000 may include forming an etching mask layer 1600 and an etching pattern layer 1700 on the semiconductor structure 3000, and etching the semiconductor structure 3000 according to a pattern of the etching pattern layer 1700, and removing the etching mask layer 1600 and the etching pattern layer 1700.

The etching mask layer 1600 may serve as a mask for consecutively etching the first conductivity type semiconductor layer 3100, the active material layer 3300, the second conductivity type semiconductor layer 3200, and the conductive electrode material layer 3700 of the semiconductor structure 3000. The etching mask layer 1600 may include a first etching mask layer 1610 including an insulating material and a second etching mask layer 1620 including metal.

The insulating material included in the first etching mask layer 1610 of the etching mask layer 1600 may be an oxide or a nitride. Examples of the insulating material may include silicon oxide (SiOx), silicon nitride (SiNx), and silicon oxynitride (SiOxNy). The first etching mask layer 1610 may have a thickness in the range of 0.5 μm to 1.5 μm without being limited thereto.

The second etching mask layer 1620 may not be limited in material as long as it can serve as a mask for consecutively etching the semiconductor structure 3000. For example, the second etching mask layer 1620 may include chrome (Cr). The second etching mask 1620 may have a thickness in the range from 30 nm to 150 nm without being limited thereto.

The etching pattern layer 1700 formed on the etching mask layer 1600 may include at least one nanopattern separated from each other thereon. The etching pattern layer 1700 may serve as a mask for consecutively etching the semiconductor structure 3000. There is no limitation on the etching method as long as it can form a pattern including a polymer, a polyethylene sphere, or a silica sphere on the etching pattern layer 1700.

For example, in the case where the etching pattern layer 1700 includes a polymer, it may be possible to employ a conventional method for forming a pattern with the polymer. For example, it may be possible to use a method such as photolithography, e-beam lithography, nanoimprint lithography to form the etching pattern layer 1700 including the polymer.

Particularly, the structure, shape, and separation interval of the etching pattern layer 1700 may be associated with the shape of the finally manufactured light emitting element 300. However, because the light emitting element 300 may have a different shape as described above, the etching pattern layer 1700 is not particularly limited in structure. For example, if the etching pattern layer 1700 has a pattern of circles separated from each other, the semiconductor structure 3000 may be vertically etched to manufacture the light emitting element 300 having a cylinder shape. However, the present disclosure is not limited thereto.

Next, the semiconductor structure 3000 may be etched according to the pattern of the etching pattern layer 17000 to form the element rod ROD. An area in which a plurality of nanopatterns are spaced apart in the etching pattern layer 1700 may be vertically etched to form a hole h. The hole h may be selectively formed from the etching mask layer 1600 to the area where the separating layer 1300 is formed.

The hole h may be formed using a conventional method. For example, the etching process may be performed with dry etching, wet etching, reactive ion etching (RIE), inductively coupled plasma reactive ion etching (ICP-RIE), or the like. The dry etching is capable of anisotropic etching, which may be appropriate for forming a hole h through vertical etching. In the case of using the aforementioned etching technique, it may be possible to use $Cl_2$ or $O_2$ as an etchant. However, the present disclosure is not limited thereto.

In some embodiments, etching the semiconductor structure 3000 may be carried out with a combination of the dry etching and the wet etching. For example, it may be possible to perform etching in a depth direction with the dry etching, and then anisotropic etching with the wet etching, such that the etched sidewalls are placed on the plane perpendicular to the surface.

Meanwhile, forming the element rod ROD by etching the semiconductor structure 3000 may include patterning the separating layer 1300 together during one etching process or patterning part of the separating layer 1300 after the element rod ROD is formed through another etching process.

That is, the separating layer 1300 may be patterned together in the etching process of forming the hole by etching the semiconductor structure 3000 or patterned in a separate process after acting as an etching stopper in the process of etching the semiconductor structure 3000.

For example, as shown in FIG. 10, when patterning the semiconductor structure 3000, when the etchant does not include an etchant for removing the separating layer 1300, only the semiconductor structure 3000 is etched to form the hole h, and the separating layer 1300 is not etched and may function as an etching stopper. Accordingly, the element rod ROD may be formed in the state where the separating layer 1300 is not etched, and the separating layer 1300 may be patterned through a different etching process. On the other hand, although not shown in the drawing, when the etchant includes an etchant for removing the separating layer 1300, the semiconductor structure 3000 and the separating layer 1300 may be etched together, but the present disclosure is not limited thereto.

As described with reference to FIG. 11, the mask layer 1600 and the etching pattern layer 1700 remaining on the vertically etched semiconductor structure 3000 may be removed by a conventional method, e.g., dry etching and wet etching, to form the element rod ROD.

Figure 12:
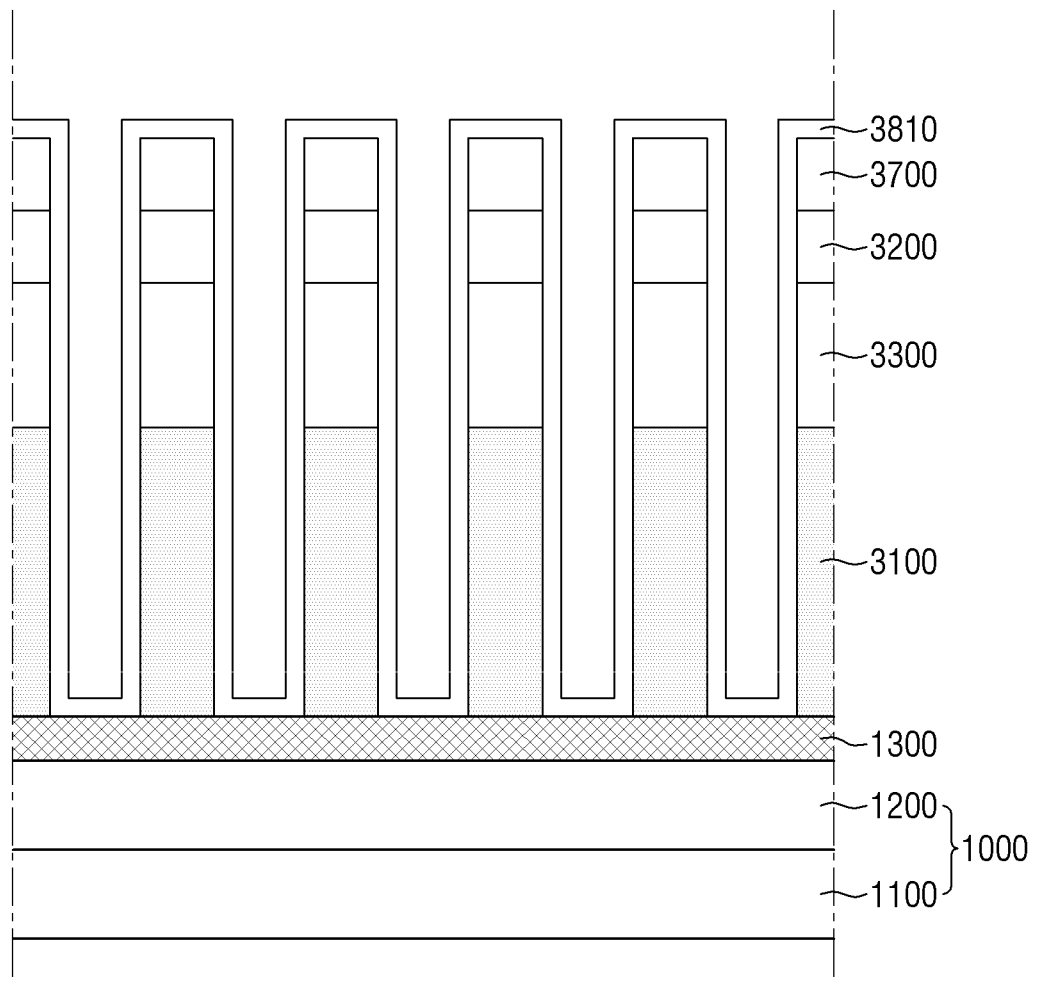
Figure 13:
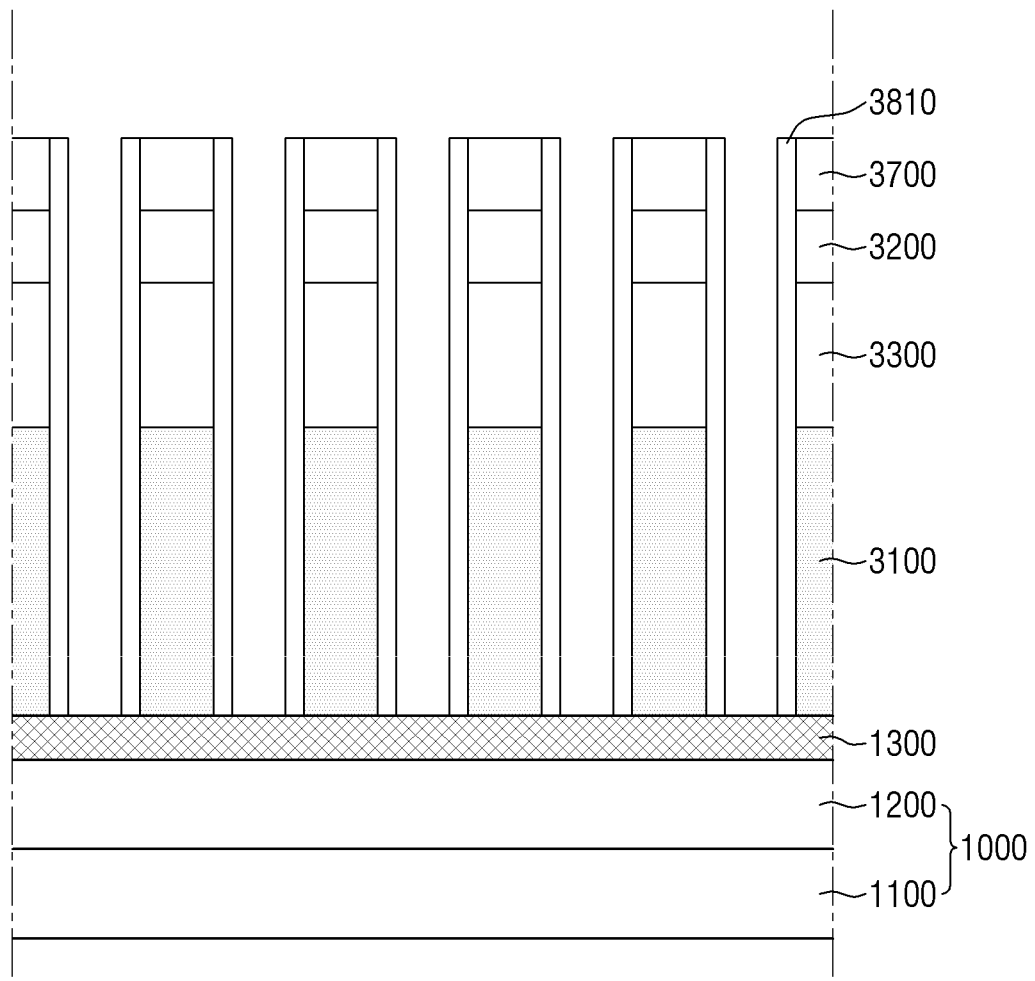

Next, referring to FIGS. 12 and 13, a first insulating layer 3810 partially surrounding the outer surface of the element rod ROD is formed.

The first insulating material layer 3810 is an insulating material formed on the outer surface of the element rod ROD, and may be formed by depositing the insulating material on the outer surface of the vertically etched element rod ROD or dipping the element rod ROD in the insulating material, without being limited thereto. For example, the first insulating material layer 3810 may be formed using atomic layer deposition (ALD). The first insulating layer 3810 may form the first insulating layer 381 of the light emitting element 300. As described above, the first insulating material layer 3810 may include a material such as silicon oxide (SiOx), silicon nitride (SiNx), silicon oxynitride (SiOxNy), aluminum oxide ($Al_2O_3$), and aluminum nitride (AlN).

Referring to FIG. 12, the first insulating layer 3810 may be formed on the side and top surfaces of the element rod ROD, and on the separating layer 1300 or the buffer material layer 1200 exposed to the outside by etching the element rod ROD in a separated state. In order to expose both end side surfaces of the element rod ROD, the first insulating material layer 3810 formed on the top surface of the element rod ROD needs to be removed. Accordingly, it may be necessary to partially remove the first insulating material layer 3810 formed in a direction perpendicular to the lengthwise direction of the element rod ROD, i.e., the direction parallel with the base substrate 1100. That is, as illustrated in FIG. 13, at least the top surface of the element rod ROD and the first insulating layer 3810 disposed on the separating layer 1300 or the buffer material layer 1200 may be removed to expose the top surface of the element rod ROD. In order to accomplish this, a process such as dry etching as anisotropic etching or etch-back may be performed.

Figure 14:
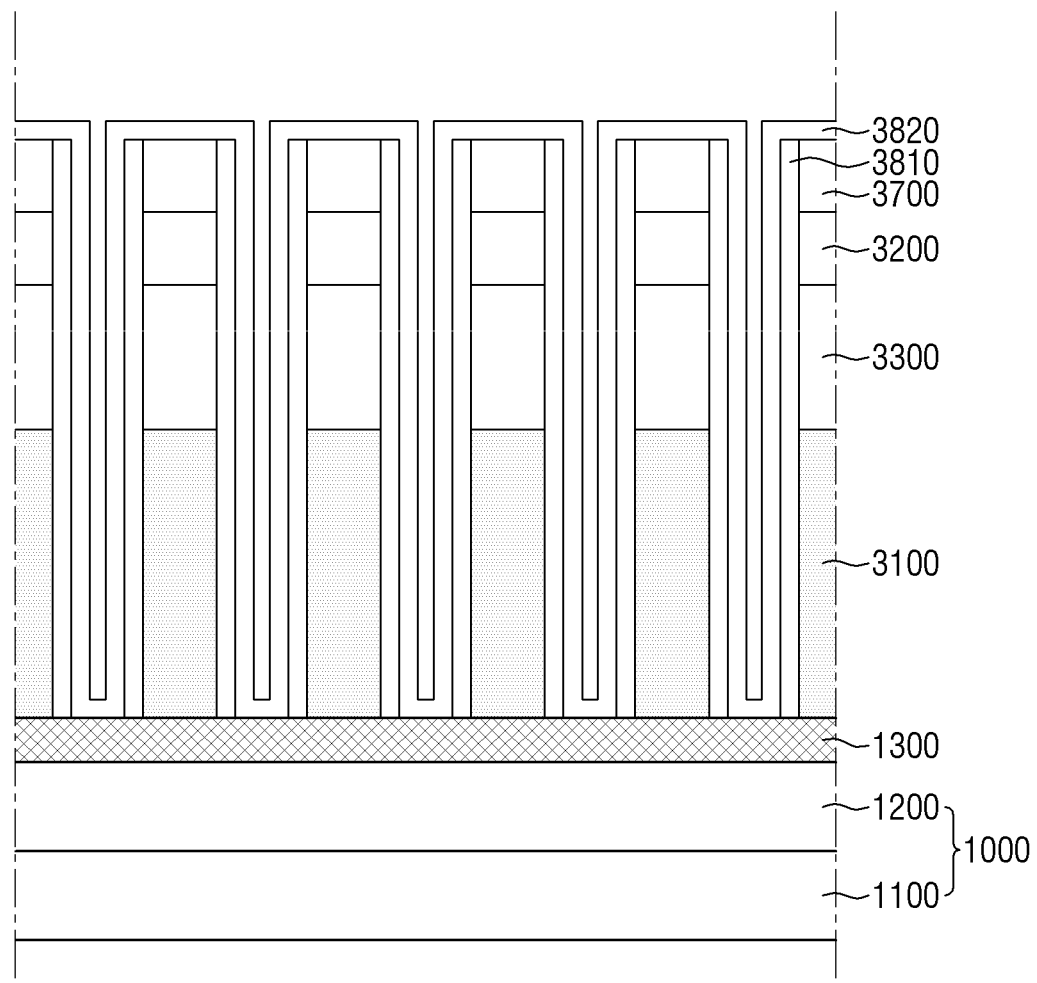
Figure 15:
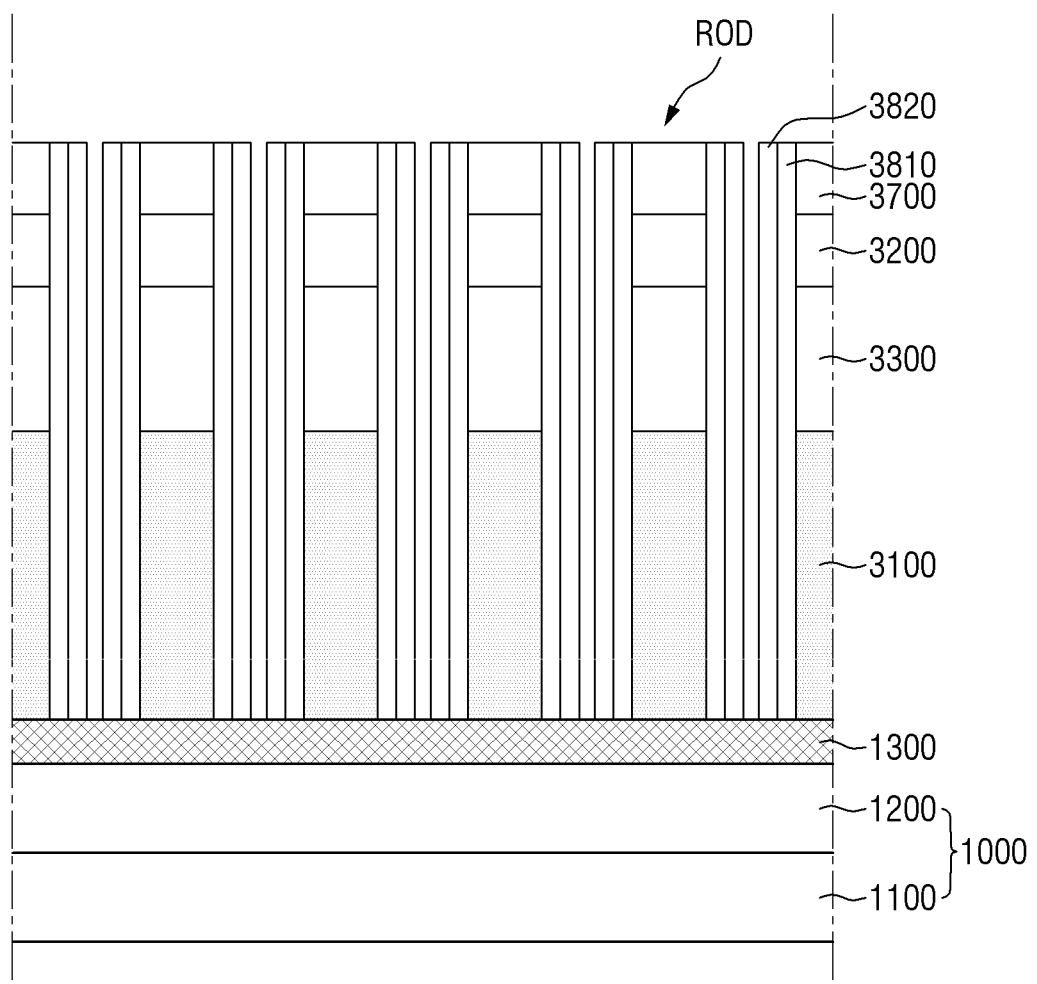

Next, referring to FIGS. 14 and 15, a second insulating layer 3820 surrounding the outer circumferential surface of the first insulating layer 3810 is formed. The second insulating layer 3820 may have a different material from the first insulating layer 3810, and they may be formed by substantially the same method.

The second insulating layer 3820 may form the second insulating layer 382 in the light emitting element 300 manufactured by separating the element rod ROD from the lower substrate layer 1000. Separating the element rod ROD from the lower substrate layer 1000 may be performed by etching and removing the separating layer 1300. In this case, the second insulating layer 3820 may prevent the first insulating layer 3810 from being damaged when the separating layer 1300 is etched.

According to an embodiment, the second insulating layer 3820 may include a material different in etch selectivity from the first insulating layer 3810 and the separating layer 1300. The material that may be included in the second insulating layer 3820 may be substantially the same as the material that may be included in the second insulating layer 382 described above.

Figure 16:
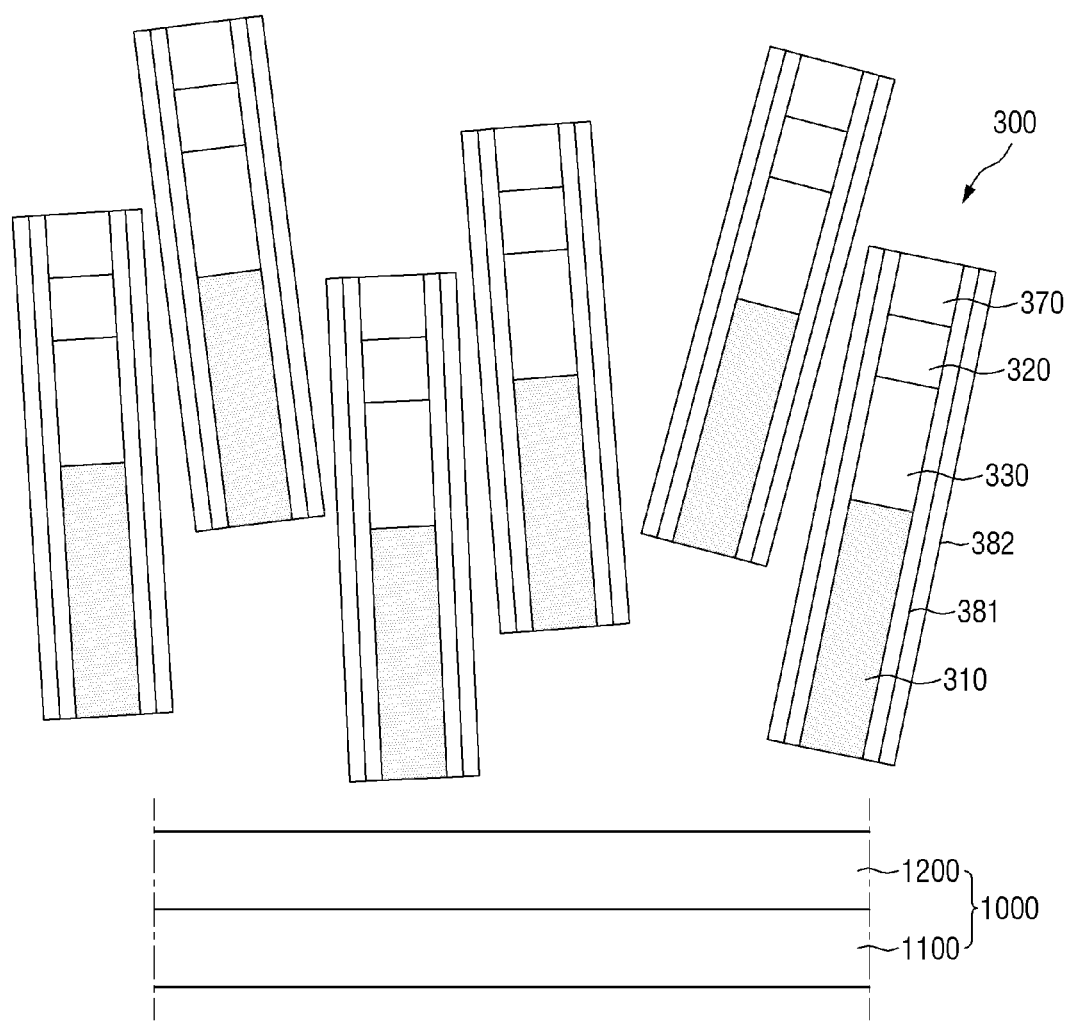

Finally, as shown in FIG. 16, the separating layer 1300 on the lower substrate layer 1000 is removed to separate the element rod ROD, thereby manufacturing the light emitting element 300.

Separating the element rod ROD may include removing the separating layer 1300 by the chemical lift off (CLO) method. In order to remove the separating layer 1300, a wet etching process may be performed using an etchant for separation such as hydrofluoric acid (HF) or buffered oxide etch (BOE), but is not limited thereto.

As described above, the second insulating layer 3820 may be maintained without damaging the material by the etchant for separation, and may function to protect the first insulating layer 3810. Accordingly, the outer circumferential surfaces of the manufactured light emitting element 300 may be maintained such that the first insulating layer 381 and the second insulating layer 382 are smooth. In addition, the first insulating layer 381 may have substantially uniform thickness in the long axis direction crossing both ends of the light emitting element 300.

For example, when the separating layer 1300 is removed by the etchant for separation containing fluorine (F), the first insulating layer 3810 and the second insulating layer 3820 may not be damaged. That is, the second insulating layer 3820 may have an etch selectivity, with respect to the etchant for separation, that is greater than an etch selectivity of the first insulating layer 3810, with respect to the etchant for separation. In addition, the second insulating layer 3820 may have an etch selectivity, with respect to the etchant for separation, that is greater than an etch selectivity of the separating layer 1300, with respect to the etchant for separation.

For example, when the first insulating layer 3810 includes aluminum oxide ($Al_2O_3$) and the separating layer 1300 includes silicon oxide (SiOx), in the step of removing the separating layer 1300, a part of the first insulating layer 3810 may be removed together by the etchant for separation. In this case, some members of the light emitting element 300 may be exposed to cause defects in the light emitting element 300. In order to prevent this, when the second insulating layer 3820 including a material different in etch selectivity, for example, silicon nitride (SiNx), is formed on the outer circumferential surface of the first insulating layer 3810 to remove the separating layer 1300, the first insulating layer 3810 may be protected from the etchant for separation.

Accordingly, even if the separating layer 1300 is removed, the manufactured light emitting element 300 may be formed such that the second insulating layer 382 surrounds the outer circumferential surface thereof, and may maintain a smooth surface without being damaged by the etchant for separation.

Figure 17:
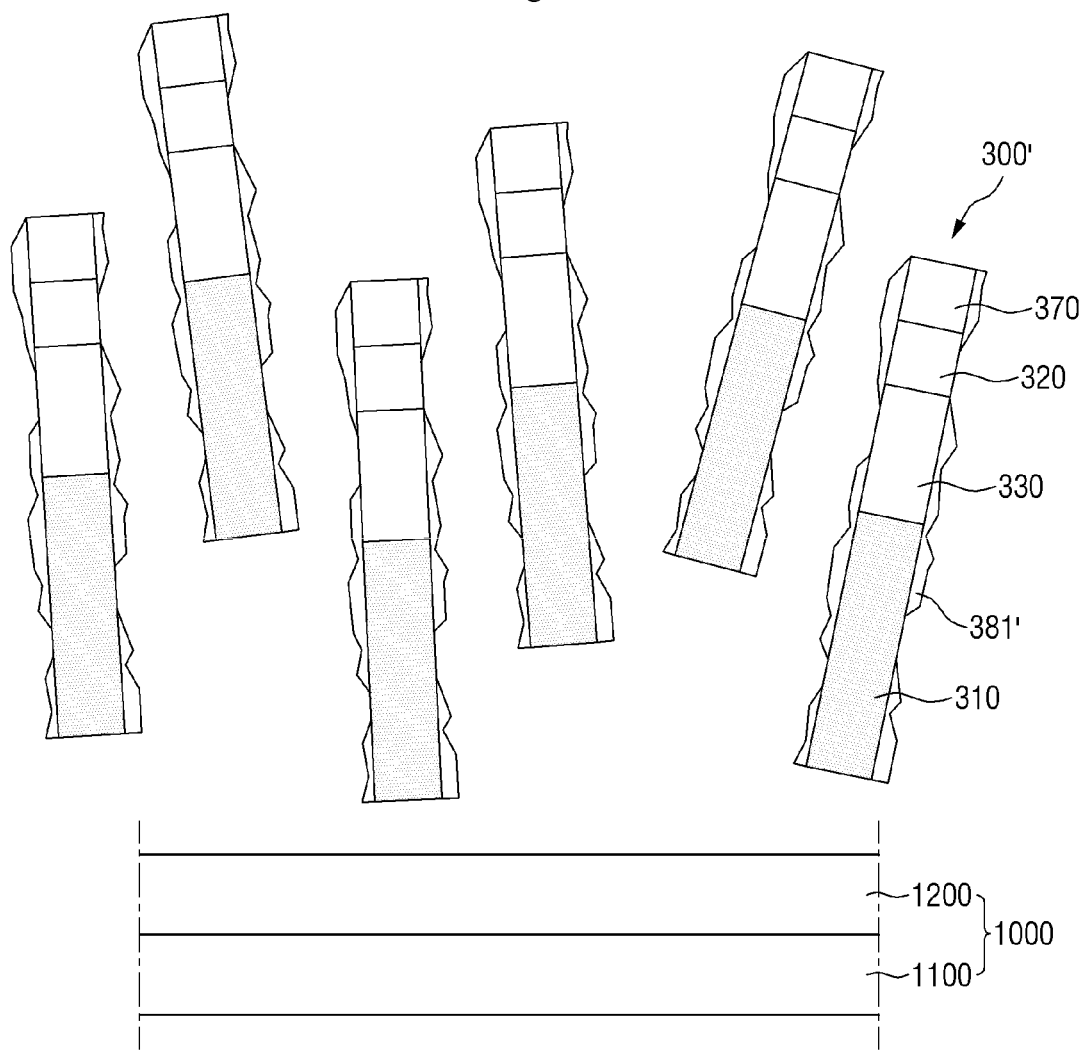
FIG. 17 is a schematic view showing a part of a method of manufacturing a light emitting element according to a comparative example.

Meanwhile, when the second insulating layer 3820 is omitted, a part of the material included in the first insulating layer 3810 may be damaged in the step of removing the separating layer 1300. FIG. 17 is a schematic view showing a part of a method of manufacturing a light emitting element according to a comparative example.

Referring to FIG. 17, it can be seen that when the separating layer 1300 is removed without forming the second insulating layer 3820, a part of the material included in the first insulating layer 3810 is damaged, and a first insulating layer 381' of a manufactured light emitting element 300' has a rough surface. In this case, a part of the element active layer 330 or the conductivity type semiconductors 310 and 320 of the light emitting element 300' may be exposed and damaged, so that the light emitting element 300' may be defective, and the first insulating layer 381' having a rough surface may cause a contact failure between the light emitting element 300' and the contact electrode 260.

On the other hand, as illustrated in FIG. 16, after the second insulating layer 3820 is formed, the light emitting element 300 manufactured by removing the separating layer 1300 includes the second insulating layer 382. Thus, it is possible to prevent damage to the materials of the first insulating layer 381 and the second insulating layer 382 by the etchant for separation, and to keep smooth the outer circumferential surface of the light emitting element 300. Accordingly, the conductivity type semiconductors 310 and 320 or the element active layer 330 may be protected from exposure, and contact defects between the light emitting element 300 and the contact electrode 260 may be reduced.

In addition, the light emitting element 300 manufactured by the chemical lift off (CLO) method can maintain a flat and smooth end surface, and at the same time, the plurality of light emitting elements 300 can have uniformity of the end surfaces.

As described above, the method of manufacturing the light emitting element 300 according to an embodiment may include forming the second insulating layer 3820 to surround the first insulating layer 3810, and removing the separating layer 1300 by the chemical lift off (CLO) method. The second insulating layer 3820 includes a material different in etch selectivity from the first insulating layer 3810 and the separating layer 1300, so that when the separating layer 1300 is removed, damage to materials of the first insulating layer 3810 and the second insulating layer 3820 can be prevented. Accordingly, the manufactured light emitting element 300 can maintain a smooth surface without damaging the material of the outer circumferential surface thereof, and is separated by the chemical lift off (CLO) method, so that the end surface is flat and uniformity can be secured. In addition, the disconnection of the contact electrode material is prevented at both end surfaces of the light emitting element 300 contacting the contact electrode 260, thereby improving light emission reliability of the display device 10.

Meanwhile, the step of forming the first insulating layer 3810 and the second insulating layer 3820 includes a partial etching step to expose the top surface of the element rod ROD, respectively. Here, the etching step to expose the top surface of the element rod ROD may be performed by forming the first insulating layer 3810 and the second insulating layer 3820 and etching them simultaneously.

Figure 18:
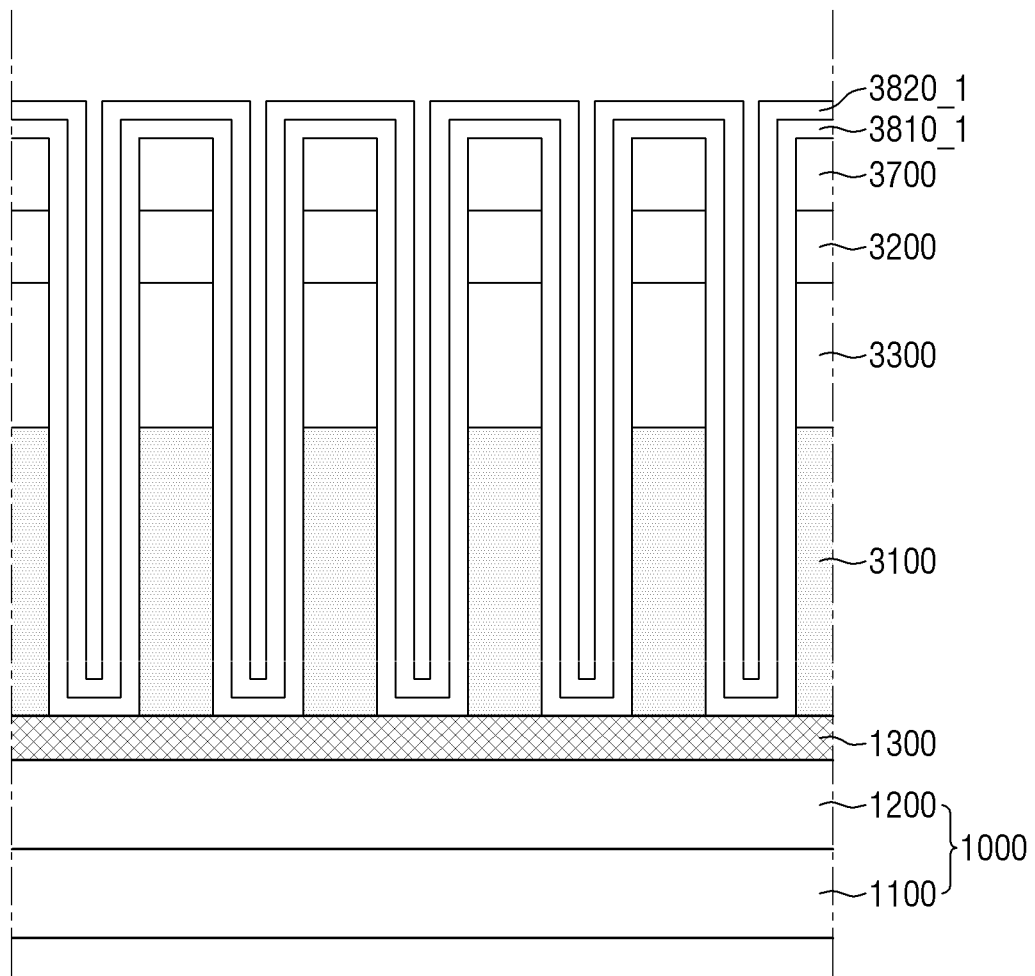
FIG. 18 is a schematic view showing a part of a method of manufacturing a light emitting element according to another embodiment.

FIG. 18 is a schematic view showing a part of a method of manufacturing a light emitting element according to another embodiment.

Referring to FIG. 18, a first insulating layer 3810_1 may be formed to surround the outside of the element rod ROD, and a second insulating layer 3820_1 surrounding the outside of the first insulating layer 3810_1 may be formed before exposing the top surface of the element rod ROD. In other words, the step of exposing the top surface of the element rod ROD by etching a part of the first insulating layer 3810_1 is omitted, and the second insulating layer 3820_1 is formed directly on the first insulating layer 3810_1. Thereafter, in order to expose the top surface of the element rod ROD, an etching process of partially removing the first insulating layer 3810_1 and the second insulating layer 3820_1 may be performed simultaneously.

In this case, since the process of forming the first insulating layer 3810_1 or the second insulating layer 3820_1 and the etching process for exposing the top surface of the element rod ROD can be performed at one time, there are advantages in the process. Also, in some cases, the first insulating layer 3810_1 and the second insulating layer 3820_1 may be removed through one etching process through dry etching.

Meanwhile, the arrangement of the separating layer 1300 is not limited to the arrangement shown in FIG. 7. The separating layer 1300 may have a pattern such that a portion of the buffer material layer 1200 of the lower substrate layer 1000 is exposed, and in some cases, a first sub-conductivity type semiconductor layer may be disposed on the buffer material layer 1200, and the separating layer 1300 may be disposed thereon. Hereinafter, other embodiments of the separating layer 1300 will be described.

Figure 19:
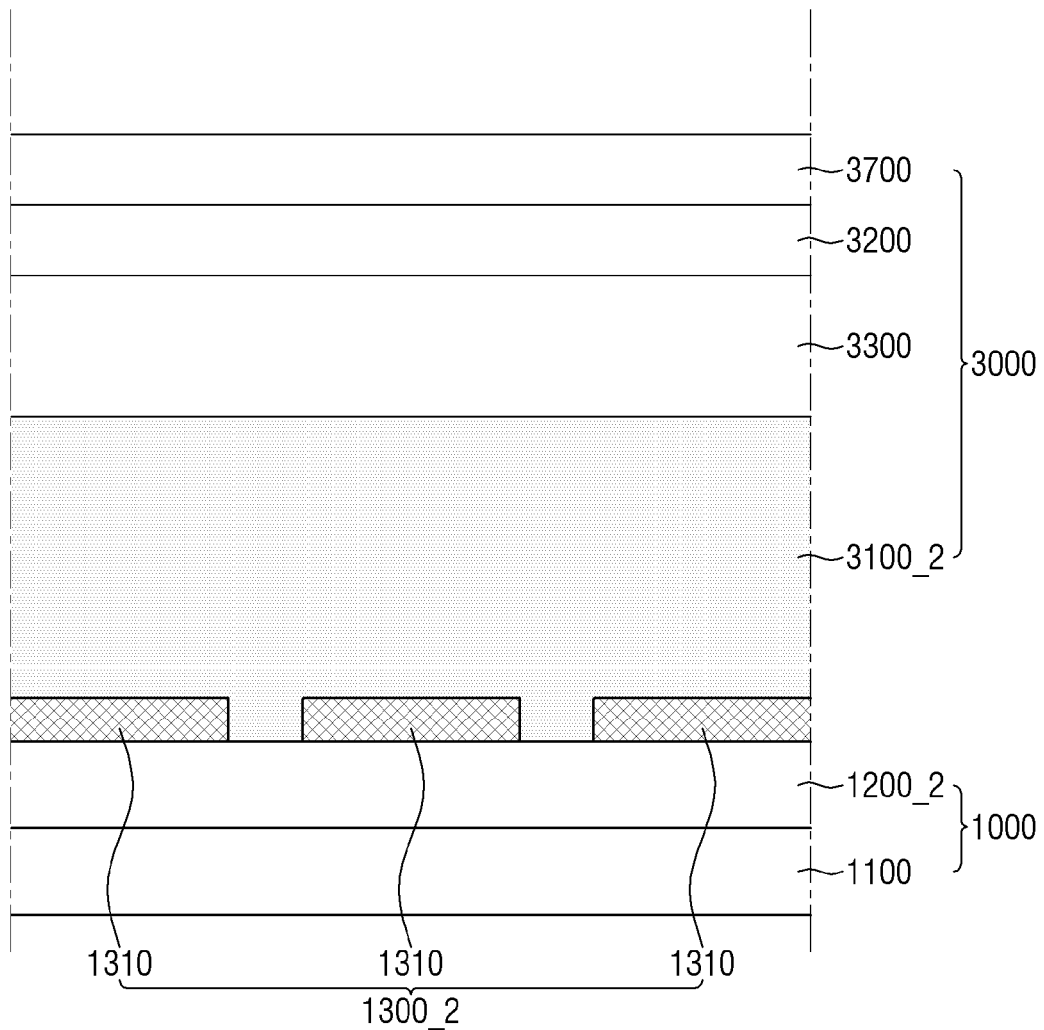
FIGS. 19 and 20 are cross-sectional views schematically showing the arrangement of a separating layer in a semiconductor structure according to another embodiment.
Figure 20:
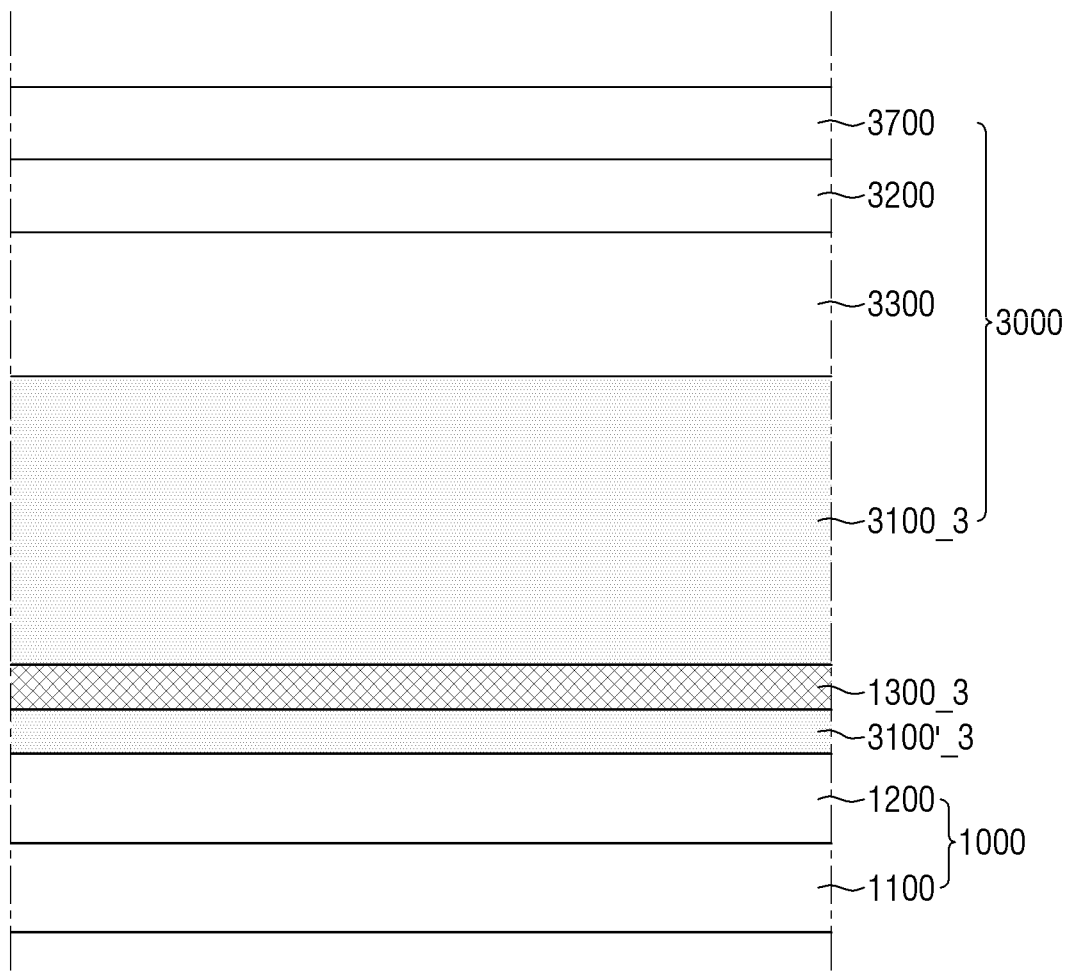

FIGS. 19 and 20 are cross-sectional views schematically showing the arrangement of a separating layer in a semiconductor structure according to another embodiment. According to an embodiment, a separating layer 1300_2 may have a plurality of separating layer masks 1310 spaced apart from each other to form a pattern.

According to FIG. 19, a first conductivity type semiconductor layer 3100_2 may be grown from a buffer material layer 1200_2. In this case, defects between the grain boundaries of the first conductive type semiconductor layer 3100_2 may be reduced further than when the first conductive type semiconductor layer 3100_2 directly grows on the separating layer 1300_2. The crystals of the first conductivity type semiconductor layer 3100_2 are grown between the separation spaces of the separating layer masks 1310 of the separating layer 1300_2, and the crystals merge on the separating layer masks 1310. Thus, a grain boundary may be formed only in a region where the crystals merge. That is, the number of defects between the grain boundaries in the first conductivity type semiconductor layer 3100_2 finally formed by forming the separating layer masks 1310 may be reduced.

Also, the separating layer 1300 may be disposed in the first conductivity type semiconductor layer 3100 of the semiconductor structure 3000.

With reference to FIG. 20, a separating layer 1300_3 may be arranged on a first sub-conductivity type semiconductor layer 3100'_3 deposited on the buffer material layer 1200, and a first conductivity type semiconductor layer 3100_3 may be deposited thereon. The first sub-conductivity type semiconductor layer 3100'_3 may include a material substantially identical with that of the first conductivity type semiconductor layer 3100_3. That is, the separating layer 1300_3 may be arranged in the first conductivity type semiconductor layer 3100_3.

As described above, the buffer material layer 1200 may provide a seed crystal of the first conductivity type semiconductor layer 3100 growing on the separating layer 1300, and may reduce the grid constant of the interfaces. The semiconductor structure 3000 of FIG. 20 may facilitate crystal growth of the first conductivity type semiconductor layer 3100_3 by substantially including the separating layer 1300_3 in the first conductivity type semiconductor layer 3100_3.

Meanwhile, the second insulating layer 382 of the light emitting element 300 may include a material having the same etch selectivity as the plurality of insulating layers of the display device 10, for example, the second insulating material layer 520. In this case, when the display device 10 is manufactured, a part of the second insulating layer 382 may be removed in a patterning step performed to contact the contact electrodes 260 at both ends of the light emitting element 300. Accordingly, the first insulating layer 381 of the light emitting element 300 may be partially exposed, and the contact electrode 260 may partially contact the first insulating layer 381.

Figure 21:
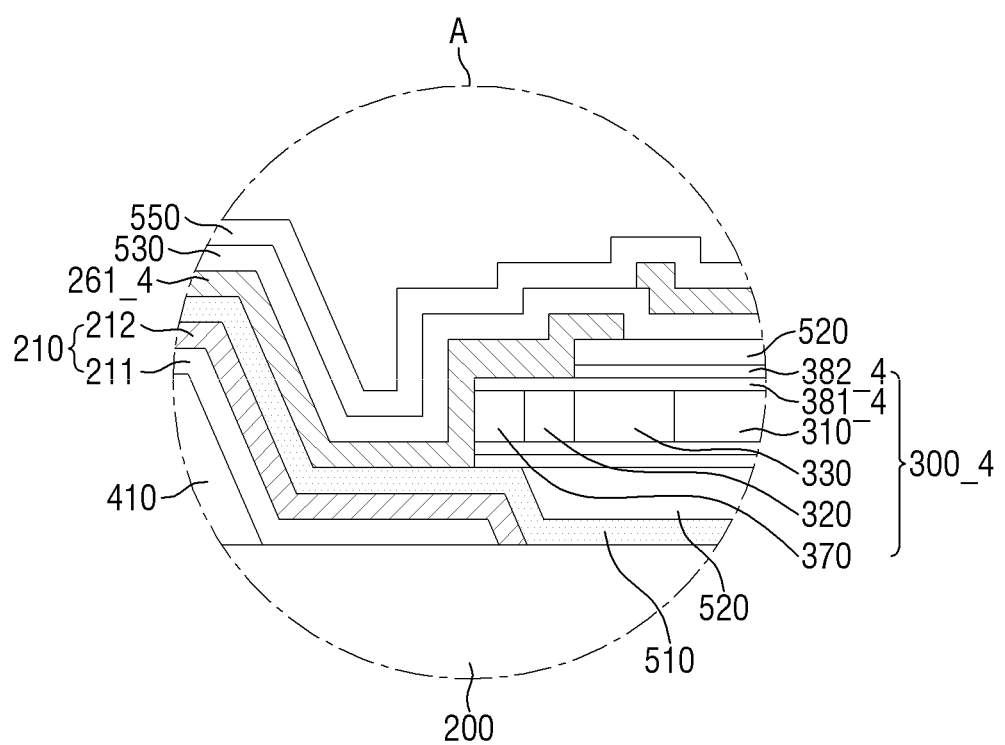
FIG. 21 is a cross-sectional view illustrating a portion of a display device according to another embodiment.

FIG. 21 is a cross-sectional view illustrating a portion of a display device according to another embodiment.

According to an embodiment, the display device 10 may be disposed such that at least a portion of a second insulating layer 382_4 of a light emitting element 300_4 is removed, and the contact electrode 260 partially overlaps the first insulating layer 381_4.

In the display device 10 shown in FIG. 21, the second insulating layer 382_4 on the top surface of a light emitting element 300_4 in cross-sectional view is partially removed, and the first insulating layer 381_4 is partially exposed. Although only a first contact electrode 261_4 in contact with the first insulating layer 381_4 on one end side of the light emitting element 300_4 is shown in the drawing, it is obvious that the first insulating layer 381_4 on the other end side of the light emitting element 300_4 may contact the second contact electrode 262 in the same way.

Referring to FIG. 21, the contact electrode 260 according to an embodiment may contact the exposed first insulating layer 381_4. Unlike the display device 10 of FIG. 2, when the second insulating layer 382_4 includes a material having the same etch selectivity as the second insulating material layer 520, the second insulating layer 382_4 may be partially etched in the step of patterning the second insulating material layer 520 when manufacturing the display device 10. Accordingly, since the first insulating layer 381_4 is partially exposed, and the first insulating layer 381_4 includes a material different in etch selectivity from the second insulating layer 382_4, the first insulating layer 381_4 is hardly damaged. That is, the first conductivity type semiconductor 310, the element active layer 330, the second conductivity type semiconductor 320, and the electrode material layer 370 of the light emitting element 300_4 can be protected by the first insulating layer 381_4.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

The invention claimed is:

1. A manufacturing method of a light emitting element, the method comprising:
   preparing a lower substrate comprising a substrate and a buffer semiconductor layer formed on a surface of the substrate;
   forming an element rod by forming a separating layer on the lower substrate; forming a first conductivity type semiconductor layer, an active material layer, and a second conductivity type semiconductor layer on the separating layer; and etching the first conductivity type semiconductor layer, the active material layer, the second conductivity type semiconductor layer, and the separating layer in a first direction perpendicular to an extension direction of the surface of the substrate;
   forming a first insulating layer surrounding an outer surface of the element rod along a second direction perpendicular to the first direction;
   forming a second insulating layer surrounding an outer surface of the first insulating layer along the second direction; and
   separating the element rod from the lower substrate to form a light emitting element,
   wherein the forming of the first insulating layer comprises:
     forming a first insulating layer to cover an outer surface and a top surface of the element rod; and
     a first etching step of exposing the top surface of the element rod by etching the first insulating layer, and
   wherein the forming of the second insulating layer comprises:
     forming a second insulating layer to cover the outer surface and the top surface of the element rod; and
     a second etching step of exposing the top surface of the element rod by etching the second insulating layer, and
   wherein in the light emitting element, a parting surface where the element rod is separated by removing the separating layer has a surface roughness in a range of 8 nm Ra to 12 nm Ra.

2. The manufacturing method of claim 1, wherein the forming of the light emitting element comprises etching and removing the separating layer by an etchant for separation containing fluorine (F), and
   the second insulating layer has an etch selectivity with respect to the etchant, which is greater than an etch selectivity of the separating layer with respect to the etchant.

3. The manufacturing method of claim 2, wherein the second insulating layer has an etch selectivity with respect to the etchant, which is greater than an etch selectivity of the first insulating layer with respect to the etchant.

4. The manufacturing method of claim 3, wherein the first insulating layer includes at least one of silicon oxide ($SiO_x$), aluminum oxide ($Al_2O_3$), and silicon oxynitride ($SiO_xN_y$), and the second insulating layer includes at least one of silicon nitride ($SiN_x$), aluminum nitride (AlN), and silicon oxynitride ($SiO_xN_y$).

5. The manufacturing method of claim 4, wherein in the light emitting element, the parting surface is flat and parallel to a top surface of the second conductivity type semiconductor layer.

6. The manufacturing method of claim 1, wherein the first insulating layer has a constant thickness in a long axis direction crossing both ends of the light emitting element.

7. The manufacturing method of claim 1, wherein in the first etching step and the second etching step, at least a part of the separating layer in an area overlapping a separation region of the element rod is exposed.

8. The manufacturing method of claim 7, wherein the second insulating layer is formed to surround an outer surface of the first insulating layer after forming the first insulating layer, and the first etching step and the second etching step are simultaneously performed after forming the second insulating layer.

9. The manufacturing method of claim 1, wherein the forming of the element rod further comprises forming an electrode material layer on the second conductivity type semiconductor layer.

10. The manufacturing method of claim 9, wherein the forming of the element rod further comprises:
- forming an etching mask layer on the electrode material layer and an etching pattern layer having one or more nanopatterns separated from each other on the etching mask layer;
- forming a hole by etching an area formed by the nanopatterns being separated from each other in a direction perpendicular to the lower substrate; and
- removing the etching mask layer and the etching pattern layer.

11. The manufacturing method of claim 10, wherein the first conductivity type semiconductor layer, the active material layer, the second conductivity type semiconductor layer, and the electrode material layer include a material different in etch selectivity from the separating layer, and
- the forming of the hole further comprises etching the first conductivity type semiconductor layer, the active material layer, the second conductivity type semiconductor layer, and the electrode material layer in a direction perpendicular to the lower substrate to expose at least a portion of an overlapping area between the separating layer and the area formed by the nanopatterns being separated from each other; and etching and patterning an exposed area of the separating layer.

\* \* \* \* \*